(12) United States Patent
Toyomura et al.

(10) Patent No.: US 6,966,184 B2
(45) Date of Patent: Nov. 22, 2005

(54) PHOTOVOLTAIC POWER GENERATING APPARATUS, METHOD OF PRODUCING SAME AND PHOTOVOLTAIC POWER GENERATING SYSTEM

(75) Inventors: Fumitaka Toyomura, Nara (JP); Toshihiko Mimura, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/717,641

(22) Filed: Nov. 21, 2003

(65) Prior Publication Data

US 2004/0159102 A1 Aug. 19, 2004

(30) Foreign Application Priority Data

Nov. 25, 2002 (JP) .............................. 2002-340304

(51) Int. Cl.[7] .......................................... B60K 16/00
(52) U.S. Cl. .................. 60/641.8; 60/641.12; 136/256
(58) Field of Search ...................... 60/641.8, 641.11, 60/641.12; 136/244, 256, 257, 258, 259

(56) References Cited

U.S. PATENT DOCUMENTS

| | | | |
|---|---|---|---|
| 4,274,044 A * | 6/1981 | Barre | 320/102 |
| 4,773,944 A | 9/1988 | Nath et al. | 136/249 |
| 5,397,401 A | 3/1995 | Toma et al. | 136/259 |
| 5,589,006 A | 12/1996 | Itoyama et al. | 136/248 |
| 5,703,468 A * | 12/1997 | Petrillo | 320/101 |
| 5,849,107 A | 12/1998 | Itoyama et al. | 136/248 |
| 6,018,123 A | 1/2000 | Takada et al. | 136/248 |
| 6,063,996 A | 5/2000 | Takada et al. | 136/246 |
| 6,066,797 A | 5/2000 | Toyomura et al. | 136/251 |
| 6,075,202 A | 6/2000 | Mori et al. | 136/251 |
| 6,093,884 A | 7/2000 | Toyomura et al. | 136/244 |
| 6,182,403 B1 | 2/2001 | Mimura et al. | 52/173.3 |
| 6,184,457 B1 * | 2/2001 | Tsuzuki et al. | 136/256 |
| 6,207,889 B1 | 3/2001 | Toyomura et al. | 136/244 |
| 6,245,987 B1 | 6/2001 | Shiomi et al. | 136/244 |
| 6,307,144 B1 | 10/2001 | Mimura et al. | 136/244 |
| 6,331,671 B1 | 12/2001 | Makita et al. | 136/244 |
| 6,437,235 B1 | 8/2002 | Komori et al. | 136/251 |
| 6,479,744 B1 | 11/2002 | Tsuzuki et al. | 136/256 |
| 6,515,215 B1 | 2/2003 | Mimura | 136/244 |
| 6,515,218 B1 * | 2/2003 | Shimizu et al. | 136/256 |
| 6,545,211 B1 | 4/2003 | Mimura | 136/244 |
| 6,657,118 B2 | 12/2003 | Toyomura et al. | 136/244 |
| 6,703,555 B2 * | 3/2004 | Takabayashi et al. | 136/244 |
| 2001/0035180 A1 * | 11/2001 | Kimura et al. | 126/572 |
| 2001/0040453 A1 | 11/2001 | Toyomura et al. | 324/332 |
| 2002/0179140 A1 | 12/2002 | Toyomura | 136/251 |
| 2003/0049881 A1 | 3/2003 | Takada et al. | 438/62 |
| 2003/0062078 A1 | 4/2003 | Mimura | 136/244 |
| 2003/0075211 A1 | 4/2003 | Makita et al. | 136/244 |
| 2003/0210562 A1 | 11/2003 | Takehara et al. | 363/24 |

FOREIGN PATENT DOCUMENTS

| | | |
|---|---|---|
| JP | 8-70533 | 3/1996 |
| JP | 11-186572 | 7/1999 |
| JP | 2000-112545 | 4/2000 |

* cited by examiner

*Primary Examiner*—Hoang Nguyen
(74) *Attorney, Agent, or Firm*—Fitzpatrick, Cella, Harper & Scinto

(57) ABSTRACT

A photovoltaic power generating apparatus is provided which comprises a single solar cell element formed on a substrate and a plurality of power conversion devices individually connected to the solar cell element for converting an output of the solar cell element.

20 Claims, 12 Drawing Sheets

TO LOAD AND SYSTEM

PHOTOVOLTAIC POWER GENERATING APPARATUS, METHOD OF PRODUCING SAME AND PHOTOVOLTAIC POWER GENERATING SYSTEM

BACKGROUND OF THE INVENTION

1. Field of the Invention

The present invention relates to a photovoltaic power generating apparatus, photovoltaic power generating system and method of producing the photovoltaic power generating apparatus.

2. Related Background Art

In recent years, with the emergence of serious problems such as global warming due to emission of carbon dioxide, etc., caused by use of fossil fuel and pollution with radio-activity by accidents at atomic power plants and nuclear waste, there is a glowing concern about global environment and energy. Under such circumstances, solar photovoltaic power generation using solar radiation, geothermal power generation using geothermal power and wind power generation using wind power, etc., are being put to practical use worldwide as inexhaustible and clean energy sources.

Of these energy sources, there are various modes of solar photovoltaic power generation using a solar cell according to an output scale from several W to several thousand kW. A typical system using a solar cell is a photovoltaic power generating system that converts DC power generated by the solar cell to AC power (DC-AC conversion) by an inverter, etc., and supplies the power generated to a load of a demander or a commercial power system (hereinafter simply referred to as "system").

FIG. 2 shows a schematic configuration of a conventional, general photovoltaic power generating system. As shown in the figure, the photovoltaic power generating system 8 generally uses a solar cell module 6 made up of a plurality of serially connected solar cell elements as a unit, forms a solar cell string 7 (also called as a "solar cell array") made up of a plurality of the serially connected solar cell modules 6, further forms a solar cell array made up of a plurality of those solar cell strings 7 connected in parallel, collects DC outputs from the solar cell arrays by a current collection box 9, converts the collected power to AC power by an inverter 3 and interconnects the AC power with a load 4 or commercial system 5. In such a photovoltaic power generating system 8, when outputs of the plurality of solar cell strings 7 vary from one string to another due to influences such as a variation in output characteristics of the solar cell or partial shadows of buildings, etc., the photovoltaic power generating system 8 may not be able to operate at optimal power points.

In order to cope with this problem, Japanese Patent Application Laid-Open No. 2000-112545 discloses a photovoltaic power generating system which provides a DC-DC converter through a connection box for each solar cell array, inputs DC output power to an inverter all together and coverts the DC power to AC power. In this configuration, each DC-DC converter performs maximum power point tracking control over the solar cell array connected thereto, and thereby improves the accuracy of the maximum power point tracking control over the photovoltaic power generating system.

Furthermore, Japanese Patent Application Laid-Open No. H08-70533 discloses the possibility of increasing and decreasing an amount of power generated by a solar cell at low costs by providing an inverter for each solar cell array, solar cell module or solar cell element, thereby reducing variations in output or difference in power efficiency due to partial shadows among solar cell arrays, solar cell modules or solar cell elements and providing an inverter for each solar cell module or solar cell element.

However, in the photovoltaic power generating system described in Japanese Patent Application Laid-Open No. 2000-112545 which inputs DC outputs of the solar cell arrays or solar cell modules to a DC-DC converter, it is necessary to serially connect a plurality of solar cell elements to create a solar cell module.

Generally, creating a solar cell module requires quite many steps such as a cutting step for dividing a photovoltaic layer stacked on a substrate into solar cell elements, an end etching step for providing a non-power generating area for insulating from one solar, cell element to another, a step of serially connecting the solar cell elements one by one using a wiring member such as an inter-connector, a step of connecting a bypass diode to reduce influences of partial shadows, a step of coating a group of serially connected solar cell elements and a step of fitting a frame at an end of the coated group of solar cell elements, and thereby takes time and uses costly members, which constitute factors responsible for increasing the price of a photovoltaic power generating apparatus.

Especially when a solar cell module having a large area is produced, the step of serially connecting many solar cell elements takes time and trouble, which constitutes a serious problem in producing a solar cell module having a large area.

Furthermore, a configuration of a plurality of solar cell elements serially connected using a wiring member such as an inter-connector requires a gap to insert the inter-connector between solar cell elements, the number of such gaps increases as the number of serially connected solar cell elements increases, which entails an increase in the non-power generation area not used for power generation in the solar cell module. As a result, the efficiency of area power generation of the solar cell module is reduced.

In addition, since the solar cell elements are serially connected, influences of partial shadows on the power generation efficiency also increases. For example, if one of the serially connected solar cell elements is covered with a partial shadow, the current generated from the cell is reduced and the rates of currents generated from other cells are also limited by this cell.

Reducing the influence of this partial shadow requires a bypass diode to be connected in parallel to each of the serially connected solar cell elements. However, even using this method cannot completely eliminate the influences of the partial shadow on other power generating cells.

Furthermore, as described in Japanese Patent Application Laid-Open No. H08-70533, providing an inverter for each solar cell element may alleviate work in the serial connection step which is the above described problem, but this requires a cutting step and an etching step at the ends of individual solar cell elements when creating those solar cell elements, which still takes time and trouble.

Furthermore, when a structure of mounting solar cell elements on a support is adopted, it is necessary to precisely locate those solar cell elements at certain intervals to improve electric insulation between the respective solar cell elements, the external appearance and efficiency of area power generation, which is however a difficult task and constitutes a factor responsible for a cost increase.

U.S. Pat. No. 4,773,944 discloses a solar cell module comprising individual solar cell elements, each of which is formed on a single substrate, all connected in parallel as a solution to all the above described problems such as the complicated step of serial connections, cost increase, influences of partial shadows and difficulty in mounting work.

This solar cell module is constructed in such a way that a current collection bus bar is connected to a current collection electrode of each solar cell element and a plurality of outputs of the solar cell elements are collected into a single output.

However, in such a configuration, the value of the current flowing through the current collection bus bar is the sum of the plurality of output currents of the solar cell elements, causing another problem that as the number of solar cell elements increases and the area of the solar cell module increases, loss in current collection also increases considerably.

To solve the problem of this current collection loss, the cross section of the current collection bus bar may be increased, but this solution causes the weight and volume of the current collection bus bar to grow considerably, making the producing/transporting work difficult.

SUMMARY OF THE INVENTION

The present invention has been implemented taking into account the above described circumstances and it is an object of the present invention to provide a photovoltaic power generating apparatus of a simple configuration capable of reducing a production cost, reducing influences of partial shadows and variations in its characteristics, a photovoltaic power generating system using the photovoltaic power generating apparatus and a method of producing the photovoltaic power generating apparatus.

The present invention is constructed as follows:

That is, a first aspect of the invention is a photovoltaic power generating apparatus comprising a single solar cell element formed on a substrate and a plurality of power conversion devices individually connected to the solar cell element for converting an output of the solar cell element.

It is preferred that the plurality of power conversion devices are DC-DC converters for boosting a DC voltage outputted from the solar cell element.

Further, it is preferred that the plurality of power conversion devices are inverters.

Moreover, it is preferred that the wiring member electrically connecting the solar cell element and the power conversion device has an exposed live section in at least a part thereof.

Further, it is preferred that the solar cell element comprises a photoelectric conversion layer, a current collection electrode disposed on a light-receiving side of the photoelectric conversion layer, a surface wiring member and a transparent thin film resin layer, wherein at least a part of the current collection electrode or the surface wiring member has an exposed section which is not covered with the transparent thin film resin layer.

Moreover, it is preferred that the photoelectric conversion layer comprises thin film silicon.

Further, it is preferred that the substrate is conductive and a substrate side of the photoelectric conversion layer constitutes a positive electrode.

Moreover, it is preferred that the substrate is conductive and one of outputs of the solar cell element and one of outputs of the DC-DC converter are electrically connected to the substrate.

Further, it is preferred that one of outputs of the solar cell element and one of outputs of the DC-DC converter are on a low voltage side.

Moreover, it is preferred that one of outputs of the solar cell element and one of outputs of the DC-DC converter are on a high voltage side.

Further, it is preferred that the solar cell element has a portion where no power generation section is formed on two peripheral sides thereof.

Moreover, it is preferred that the solar cell element is fixed to a support through the portion where no power generation section is formed.

Further, it is preferred that the solar cell element or the photovoltaic power generating apparatus itself is sealed (or encapsulated) with a resin.

Moreover, it is preferred that the solar cell element is a minimum power generation unit having a function as a solar cell.

Further, it is preferred that the photovoltaic power generating system further comprises a plurality of current collection electrodes for individually collecting power of the solar cell element, wherein each of the plurality of current collection electrodes is connected to one of the plurality of power conversion devices such that power individually collected by the plurality of current collection electrodes is converted individually.

A second aspect of the present invention is a photovoltaic power generating system comprising:

a photovoltaic power generating apparatus comprising a single solar cell element formed on a substrate and a plurality of DC-DC converters individually connected to the solar cell element for converting an DC output of the solar cell element; and an inverter for converting outputs of the plurality of DC-DC converters to AC power and supplying the AC power to a load or interconnecting the AC power to a commercial power.

It is preferred that the inverter has an insulating transformer, and a wiring member connecting the DC-DC converter and the inverter is grounded.

A third aspect of the present invention is a photovoltaic power generating system comprising a photovoltaic power generating apparatus comprising a single solar cell element formed on a substrate, and a plurality of inverters individually connected to the solar cell element for converting outputs of the solar cell element to AC power, wherein the plurality of inverters supply the output power to a load or interconnect the output power with a commercial power system.

A fourth aspect of the present invention is a method of producing a photovoltaic power generating apparatus comprising the steps of:

forming a solar cell element on a substrate through a semiconductor producing step; and connecting a plurality of power conversion devices to predetermined portions of the solar cell element.

It is preferable to form a photoelectric conversion layer, a current collection electrode and a surface wiring member on the substrate successively to thereby form a solar cell element and connect the power conversion devices to predetermined portions of the solar cell element successively.

According to the present invention, it is possible to construct a photovoltaic power generating apparatus using only a single solar cell element formed on a substrate. For this reason, if the solar cell module is of a type that requires a cutting step, end etching step, serial connection step and bypass diode connection step, etc., for its production, the cutting step, end etching step, serial connection step and bypass diode connection step, etc., are not necessary. This leads to reductions of production and material costs. Furthermore, since the non-power generation area which is not used for power generation is reduced, the efficiency of area power generation of the photovoltaic power generating apparatus improves considerably.

Furthermore, there is no need for the work of mounting a plurality of solar cell elements at regular intervals on the support, and it is rather possible to mount a photovoltaic power generating apparatus having a solar cell element with a greater area as a unit and thereby drastically shorten the time required for mounting the photovoltaic power generating apparatus and reduce the cost required for the mounting.

In addition, the influences of partial shadows are limited only to the power conversion devices involved in the shadowed areas and have no influence on other power conversion devices. Furthermore, since only a single solar cell element is formed on the substrate, the variation in the electric characteristics of the solar cell in the photovoltaic power generating apparatus is also small. Therefore, it is possible to drastically reduce influences of partial shadows and variations in the characteristics compared with a conventional system having a plurality of serially connected solar cell elements.

Therefore, it is possible to use, for example, a single large-length solar cell element having a large area and construct a photovoltaic power generating apparatus using this. This eliminates the need for a cutting step, end etching step, serial connection step and bypass diode connection step, etc., required for producing a conventional, general solar cell module, which reduces the production and material costs accordingly. The efficiency of area power generation of the photovoltaic power generating apparatus is also improved.

Since the photovoltaic power generating apparatus is constructed of only a single solar cell element on the substrate, it is possible to obtain a semiconductor layer and electrode layer, etc., on one conductive substrate by continuous film formation. This can considerably reduce influences of partial shadows and variations in the characteristics compared to a conventional system having serially connected solar cell elements.

Furthermore, it is possible to drastically reduce the current collection loss, thereby considerably reducing the cross-sectional area of the member connecting DC-DC converters in parallel, drastically reducing the material costs, lessening the weight and improving ease of mounting.

Other features and advantages of the present invention will be apparent from the following description taken in conjunction with the accompanying drawings.

DESCRIPTION OF THE PREFERRED EMBODIMENTS

With reference now to the attached drawings, embodiments of a photovoltaic power generating apparatus and a photovoltaic power generating system according to the present invention will be explained in detail below.

(First Embodiment)

Figure 1:
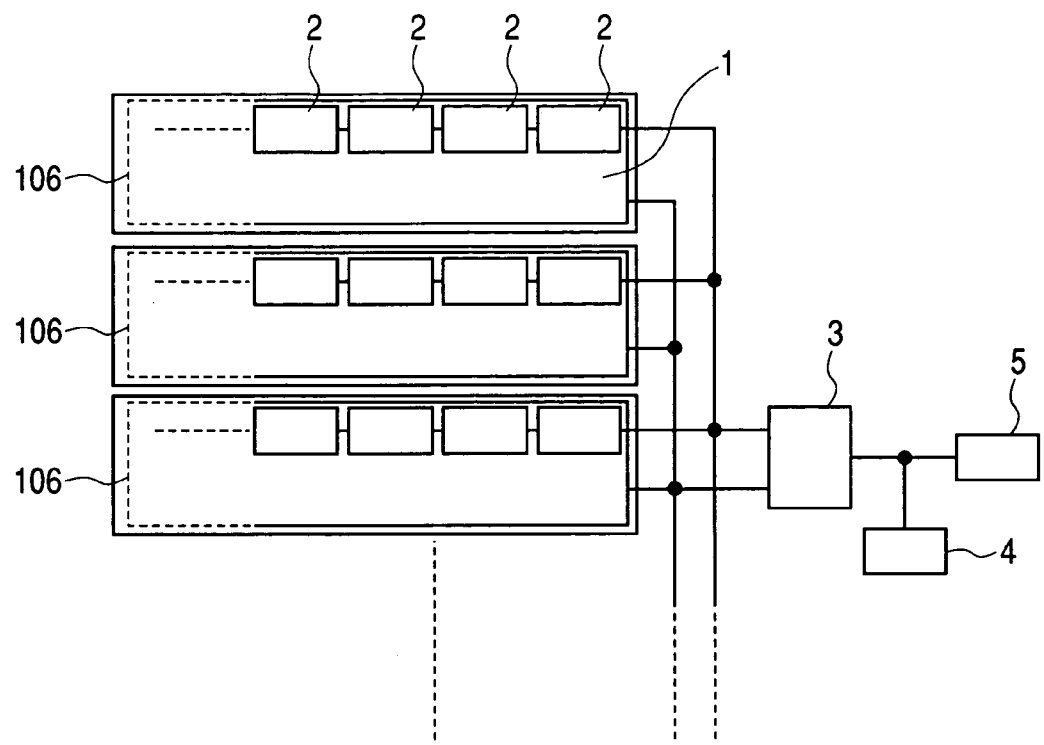
FIG. 1 is a schematic view showing a configuration of a photovoltaic power generating system according to a first embodiment of the present invention.
Figure 2:
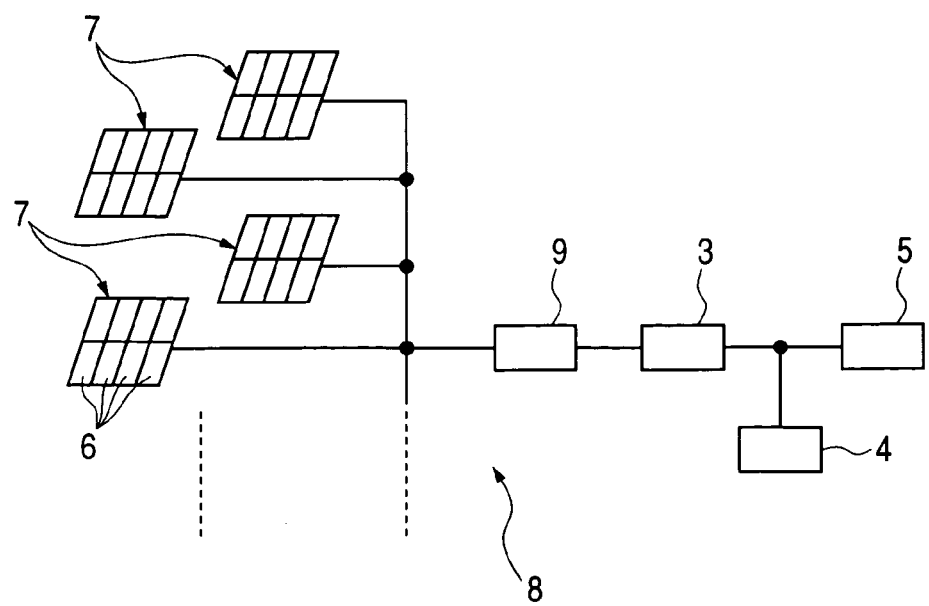
FIG. 2 illustrates a schematic configuration of a conventional, general photovoltaic power generating system.

FIG. 1 is a schematic view showing a configuration of a photovoltaic power generating system according to a first embodiment of the present invention. Reference numeral 1 denotes a single solar cell element formed on a conductive substrate, 2 denotes a DC-DC converter, 3 denotes an inverter, 4 denotes a load and 5 denotes a commercial system.

The term "solar cell element" used herein refers to a minimum unit having the function as a solar cell capable of extracting electric power. For example, when a power generation area is segmented by etching lines, the solar cell element refers to a certain area having a photovoltaic layer segmented by etching lines, etc., which is a minimum unit having the function as a solar cell capable of extracting electric power therefrom. The solar cell element is not limited to one having a single photoelectric conversion layer and may also have a plurality of photoelectric conversion layers stacked one upon another. Examples of the solar cell element having a plurality of stacked photoelectric conversion layers include a tandem structure or the like, and a stacked body of a plurality of photoelectric conversion layers having different degrees of spectral sensitivity constitutes a minimum power generation unit as a solar cell from which electric power can be extracted.

Here, DC power output from the solar cell element is input to DC-DC converters 2 provided on the solar cell element at predetermined intervals, boosted to a voltage at a predetermined boosting rate, these outputs are input to the inverter 3 all together, converted to AC power at a commercial frequency, supplied to the load 4 and extra electric power is sent to the commercial system 5.

Hereinafter, the apparatus made up of the solar cell element 1 and the plurality of DC-DC converters 2 connected to the solar cell element will be called a "photovoltaic power generating apparatus 106."

The components used in the photovoltaic power generating apparatus and the photovoltaic power generating system according to this embodiment will be explained in detail below.

(Solar Cell Element)

Figure 3:
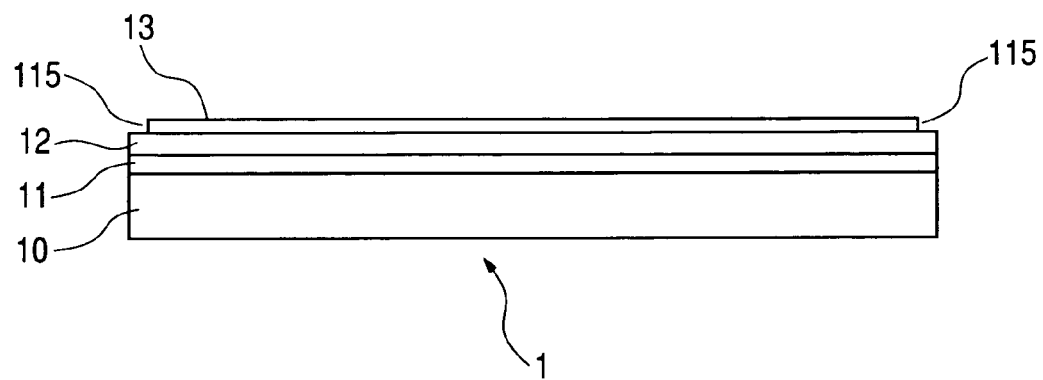
FIG. 3 is a cross sectional view showing a configuration example of the solar cell element of FIG. 1.

FIG. 3 is a cross sectional view showing a layered configuration of the solar cell element 1 formed on a conductive substrate, consisting of a lower electrode layer 11, a semiconductor layer 12, an upper electrode layer 13 stacked on a conductive substrate 10. The lower electrode layer 11 may be omitted depending on the configuration of the conductive substrate 10.

Here, as the conductive substrate 10, a substrate which is wound like a roll beforehand is preferable and it is preferable from the standpoint of productivity to stack the above described layers while feeding this substrate one by one and rewinding it at the other end to create the conductive substrate according to a continuous film formation method such as a roll-to-roll method, and a case where this method is used will be principally explained here. Of course, a batch system apparatus can also be used.

The lower electrode layer 11, semiconductor layer 12 and upper electrode layer 13 are described in detail in Japanese Patent Application Laid-Open No. 11-186572 to the assignee of this application. Since these components are not essential parts in the present invention, detailed explanations will be omitted.

As the semiconductor layer 12, thin film silicon is preferable and amorphous silicon is particularly preferable and when amorphous silicon is used as a semiconductor layer, a pin junction is normally used in which an n-type semiconductor, an i-type semiconductor and a p-type semiconductor are stacked in that order from the conductive substrate 10 side.

Moreover, it is also preferable to use a double or triple configuration in which two or three layers of the above described pin junction or pn junction are stacked.

Furthermore, this embodiment also preferably uses nip junction consisting of a p-type semiconductor, an i-type semiconductor and an n-type semiconductor stacked in that order from the conductive substrate 10-side depending on the case.

Furthermore, as a film formation method of each layer, a vapor deposition method, sputtering method, high-frequency plasma CVD method, micro-plasma CVD method, ECR method, thermal CVD method, LPCVD method, etc., can be selected from various methods which are publicly known and publicly used as appropriate.

Figure 4:
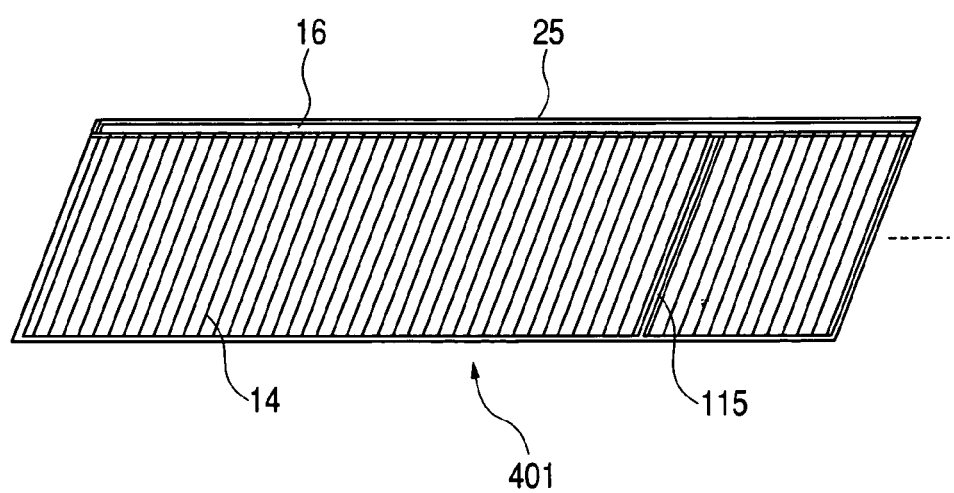
FIG. 4 illustrates a schematic configuration of the solar cell element of FIG. 1.

Then, in order to cut and divide the solar cell stacked body formed in this way into desired lengths, an etching paste containing $FeCl_3$, $AlCl_3$, etc., is applied to the upper electrode layer using a screen printing method in such a way that short-circuit between the conductive substrate and upper electrode layer produced by division/cutting does not affect the effective light-receiving area, the etching paste is heated and then cleaned, part of the upper electrode layer of the solar cell stacked body is thereby removed linearly to form etching lines 115 such as shown in FIG. 4.

Then, as shown in FIG. 4, an insulating double-side adhesive tape 25 is continuously pasted to one side of the light-receiving surface of the conductive substrate, current collection electrodes 14 are formed on the insulating double-side adhesive tape 25 and upper electrode at predetermined intervals. Furthermore, a light-receiving surface terminal member 16 is attached on the top of the insulating double-side adhesive tape 25 by heating/pressure bonding. The current collection electrodes 14 used here will be explained in detail later.

In the above-described steps, a solar cell assembly 401 provided with the current collection electrodes 14 and light-receiving surface terminal member 16 as shown in FIG. 4 is produced.

Figure 5:
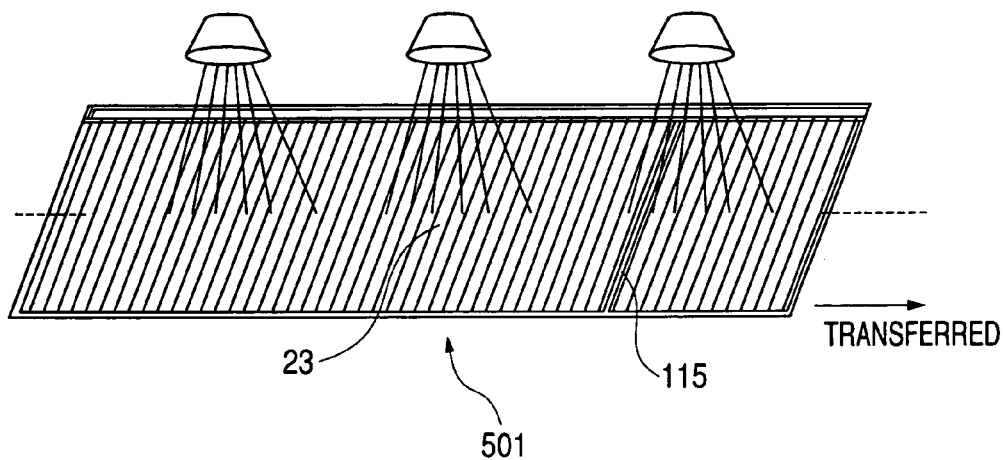
FIG. 5 illustrates a step of producing the solar cell element of FIG. 1.

Then, as shown in FIG. 5, a transparent thin film resin layer 23 is stacked on the light-receiving surface of the solar cell assembly 401 to form a solar cell assembly 501. Here, this is called a solar cell assembly in the present Specification irrespective of the presence/absence of the transparent thin film resin layer 23. Furthermore, as will be described later, suppose this will also be called a solar cell element irrespective of the presence/absence of the transparent thin film resin layer. The configuration and method of forming this transparent thin film resin layer will be described in detail later.

When the transparent thin film resin layer 23 is formed, it is also possible to form the solar cell assembly 501 by forming the transparent thin film resin layer 23 not over the entire light-receiving surface but only part thereof. Such a configuration eliminates the need for an extra insulating material and therefore decreases the cost of the photovoltaic power generating apparatus and the entire system.

More specifically, instead of providing the transparent thin film resin layer 23 over the entire surface of the solar cell assembly 401, the transparent thin film resin layer 23 is applied to only the minimum necessary portion to prevent influences on the power generation performance in an outdoor environment. That is, without forming the transparent thin film resin layer 23 on the light-receiving side terminal member 16 or etching lines 115, it is possible to coat only the portion (active area) having photoelectric conversion characteristics for at least incident light of the solar cell element.

Then, the solar cell assembly 501 on which the above described transparent thin film resin layer 23 is stacked is cut along the above described etching lines 115 to a desired length to form the solar cell element 1. Furthermore, by arranging a plurality of DC-DC converters 2, which will be described later, at predetermined intervals in the solar cell element 1 and electrically connecting them, it is possible to construct the photovoltaic power generating apparatus 106 as shown in FIG. 1. In this case, the solar cell assembly 501 is also possible to be cut after the DC-DC converters 2 are connected thereto.

Adopting such a configuration of the photovoltaic power generating apparatus eliminates etching lines for dividing the photoelectric conversion layer between the DC-DC converters, increases the area of the active area and has the effect of improving the efficiency of area conversion of the solar cell. That is, this solar cell element is provided with one minimum unit having the function as a solar cell capable of extracting electric power from the photovoltaic layer.

It is also possible to protect the solar cell element 1 from the outdoor environment by sealing it with a weather resistant film, filler and back reinforcement member, etc., in the next step as in the case of a conventional solar cell module, and the solar cell element in this configuration can also be used in the present invention in the like manner.

Then, the components of the solar cell element 1 of this embodiment will be explained in detail below.

(Conductive Substrate)

The conductive substrate 10 used in the solar cell element according to this embodiment is a member to mechanically support the semiconductor layer for photoelectric conversion and can also be used as the electrode on the non-light-receiving side of the solar cell element. As such a substrate, it is preferable to use a heat resistant substrate that can withstand a heating temperature when the semiconductor layer is formed.

Furthermore, since the conductive substrate is the part to be adhered when the solar cell element is adhered to the support such as a concrete block, it is preferable to use a material having good adhesiveness with the adhesive used.

Furthermore, when the conductive substrate is fixed to the support using a fixing member, the conductive substrate preferably has mechanical strength to withstand the fixing, weather resistance and corrosion resistance.

As the material for the conductive substrate, for example, metal such as Fe, Ni, Cr, Al, Mo, Au, Nb, Ta, V, Ti, Pt and Pb, etc., or an alloy of these metals, for example, brass, thin plate such as stainless steel or their composite, carbon sheet, zinc-plated steel plate, etc., can be used.

As the substrate, it is also possible to use an electrical insulating material, a heat-resistant synthetic resin film or sheet such as polyester, polyethylene, polycarbonate, cellulose acetate, polypropylene, polyvinyl chloride, polyvinylidene chloride, polystyrene, polyamide, epoxy, etc., or a composite of them with glass fiber, carbon fiber, boron fiber, metal fiber, and thin plate thereof, resin sheet, on the surface of which a metal thin film of different material is vapor-deposited or stacked.

(Current Collection Electrode)

The current collection electrodes 14 are generally formed in a comb-like shape on the semiconductor layer or the upper electrode layer of the solar cell element and preferable width and pitch are determined from the value of sheet resistance of the semiconductor layer or upper electrode layer.

Furthermore, the current collection electrodes are required to have low resistivity and not to constitute serial resistance of the solar cell and preferable specific resistance is $10^{-2}$ Ωcm to $10^{-6}$ Ωcm. As the material for the current collection electrodes, for example, metal such as Ti, Cr, Mo, W, Al, Ag, Ni, Cu, Sn or Pt or an alloy of these metals or solder or a metal wire to the surface of which a conductive adhesive is applied are used. Generally, a metal paste in which metal powder and polymer resin binder are formed in a paste form is used, but the material is not limited to this.

(Terminal Member)

The terminal member 16 is a member that is electrically connected to the current collection electrodes 14 to form a positive or negative lead electrode. This terminal member 16 is attached to the conductive substrate or the etching surface with the upper electrode layer of the solar cell element removed using laser welding, a conductive adhesive, brazing, etc., so as to provide electrically low resistance and attached mechanically strongly. Or the terminal member 16 is attached to the current collection electrodes by pressing. The present Specification distinguishes between a "light-receiving surface terminal member" and "non-light-receiving surface terminal member" according to the position of the solar cell element on which the terminal member is attached.

The electric performance and material, etc., required for the terminal member are almost the same as those of the above described current collection electrode, but the terminal member preferably has a foil shape to keep flatness of the solar cell element and allow low resistance.

It is also possible to spread the non-light-receiving surface terminal member over the entire non-light-receiving surface in a comb-like shape or radially to thereby improve the current collection efficiency.

Furthermore, when a terminal member for a connection with the DC-DC converters or the inverter is necessary, the terminal member is attached and drawn out to the light-receiving surface terminal member or non-light-receiving surface terminal member using a method like laser welding, a conductive adhesive or brazing, etc.

(Transparent Thin Film Resin Layer)

The transparent thin film resin layer 23 positioned on the light-receiving surface of the solar cell element in this embodiment is not limited to a particular resin layer if it is at least transparent and allows the current collection electrodes, upper electrode layer, etc., therebelow to be covered and protected. However, the transparent thin film resin layer preferably has excellent applicability, weather resistance and adhesiveness and is particularly required to have excellent water resistance.

As a specific material, fluororesin, acrylic resin, polyester, polycarbonate, etc., can be used. More specifically, polyvinylidene fluoride (PVDF) resin, polyvinyl fluoride (PVF) resin or tetrafluoroethylene-ethylene copolymer (ETFE) resin, etc., is available. From the standpoint of weather resistance, polyvinylidene fluoride resin is excellent, but from the standpoint of compatibility between weather resistance and mechanical strength and transparency, tetrafluoroethylene-ethylene copolymer is excellent. Furthermore, to realize a further cost reduction, use of a non-film material such as acrylic resin-based or fluororesin-based transparent paint is preferred. In this case, a coating method such as curtain coating used for normal applications is used.

From the requirements in production steps, as the resin paint capable of using a curtain flow coating method, it is preferable to use paint having a viscosity as low as 0.3 Pa·s or less. Furthermore, from the standpoint of further improving productivity, a spray coating method is preferable and in this case, a resin paint having a low viscosity of 0.05 Pa·s or less is preferable.

As a lower limit of viscosity, there is no particular limitation and any appropriate viscosity can be selected based on the desired film thickness. However, as the viscosity decreases, a plurality of times of painting are required to form a required film thickness, and therefore it is actually preferable to have a viscosity of 0.001 Pa·s or more.

With regard to the thickness of the transparent thin film resin layer 23, a thickness of 1 $\mu$m or more is preferable as the thickness to which the paint is applicable without pinholes and approximately 200 $\mu$m or less is preferable from the following standpoint.

From the standpoint of coating and protecting the current collection electrode, upper electrode layer or photovoltaic layer with a transparent thin film resin layer, a thicker one is preferable. However as the thickness increases, sunlight penetrates the transparent thin film resin layer less and the power generation performance deteriorates. Furthermore, forming a thick layer may deteriorate flexibility of the resin layer. Moreover, as the thickness increases, the current collection electrode, upper electrode layer or photovoltaic layer may be destroyed by contraction during hardening and when used outdoors, if the resin layer is as thick as 200 $\mu$m or more, it is no longer possible to follow forces of thermal expansion or forces applied at the time of mounting and the resin layer may have cracks caused by stress or peel off in the interface with the current collection electrode, upper electrode layer or photovoltaic layer.

However, the transparent thin film resin layer need not always be formed only of one kind of material and may be constituted of, for example, two layers formed using two kinds of materials. In this case, it is possible to select a material having good adhesiveness with the upper electrode layer right above the upper electrode layer of the solar cell element and select a material having excellent weather resistance on top of it. A typical formation method in this case may be to perform the application step twice.

(Parallel Connection Member)

Constructing the photovoltaic power generating apparatus in this embodiment requires parallel connections between the DC-DC converters respectively connected to the solar cell element. The member used to make these connections is a parallel connection member. When the conductive substrate in the solar cell element is used as a common terminal on one side, this member is used only for the electrode on one side.

More specifically, this is the member to connect the output terminals on one side of the respective DC-DC converters 2 and a general-purpose insulated electric wire or insulated cable, etc., can also be used, but bare conductive wires without any insulating coating can also be used as an example used in this embodiment. A copper wire, copper twisted wire or copper band, etc., is preferable as the bare conductive wire.

(Inter-Device Connection Member)

In this embodiment, the connection member between the DC-DC converters 2 and the inverter 3 is defined as an inter-device connection member. As the inter-device connection member, one with the same shape and material as those for the above described parallel connection member can be used. It is also possible to extend the parallel connection member used for a connection between the DC-DC converters and connect it to the inverter and use it as a substitute for the inter-device connection member.

(Support)

The support refers to a member that fixes the solar cell element and is generally a frame or a member that forms the mounting surface.

There is no limitation to the means for fixing the solar cell element to the support, but a fixing method using an adhesive is preferable because it requires only a small area of the non-power-generation area in the solar cell element. Furthermore, it is also possible to provide a non-power-generation area for mounting in part of the solar cell element and fix that part using fixing members such as nails, screws, and bolts.

For simplicity of structure and ease of mounting work, it is preferable to use a concrete material in this embodiment. This is because if the support is a heavy material such as concrete, simply placing the support completes the placement of the support (frame). Moreover, concrete has excellent outdoor durability, is inexpensive and convenient to be used as a frame of the solar cell.

Furthermore, it is preferable to construct the support by dividing, for example, a fixed support (support) having, for example, a tabular shape for fixing the solar cell and a back support for mounting this fixed support separately. This is because the mounting angle of the solar cell can be changed arbitrarily by mounting the back support having a cubic shape, etc., and then placing the fixed support having a tabular shape, etc., on this back support, which is convenient.

Then, the DC-DC converters and inverter of this embodiment will be explained in detail below.

(DC-DC Converter)

The DC-DC converter connected to the solar cell element generally consists of a voltage booster circuit which boosts a DC voltage to an input voltage of the inverter circuit, a control circuit which controls start/stop of power conversion, optimization of operating points of the solar cell and operation mode, etc., a system-connected protection circuit, a communication circuit and an input/output terminal, etc., and its output may be connected to a direct load. However, outputs of a plurality of solar cell elements are generally input to one inverter and converted AC power is used for a load or interconnected.

As the voltage booster circuit, various publicly known or publicly used circuit configurations can be used irrespective of whether they are insulated or not. The control circuit comprises, for example, a CPU, PWM waveform control circuit, a maximum power point tracking control circuit, control power supply generation circuit, frequency/voltage reference generator and switching control circuit, etc. Furthermore, the control circuit may also be made manipulatable from the outside through a communication cable, etc., or some functions of the control circuit may also be placed outside the DC-DC converters to control a plurality of power conversion devices all together.

However, to simplify the structure as much as possible, reduce the cost and improve reliability of the DC-DC converters 2 in this embodiment, the control circuit preferably comprises at least a control power supply generation circuit, a switching reference waveform generation circuit which specifies a switching frequency and a switching element drive circuit capable of driving the switching element at a fixed duty.

Furthermore, the main circuit preferably comprises a switching element which is turned ON/OFF by the above described switching element drive circuit and a switching transformer created with a predetermined turn ratio.

In a system in which a plurality of DC-DC converters which drive the switching element at the above described fixed duty are connected in parallel, it is possible to change an input voltage of the DC-DC converters by changing an input voltage of an inverter in the following stage and thereby move the operating point of the solar cell element.

Furthermore, it is also possible to integrate the DC-DC converters on a single chip and make electrical connections to the surface wiring member and conductive substrate in steps of producing the solar cell element to thereby simplify a series of operations for connecting the DC-DC converters to the solar cell element.

The DC-DC converters are preferably installed near the solar cell element in such a way that the wiring loss is reduced so as to input the output from the solar cell element efficiently and preferably directly attached to the solar cell element.

Furthermore, exterior parts of the DC-DC converters should have properties such as heat resistance, humidity resistance, water resistance, electrical insulation, low-temperature resistance, oil resistance, weather resistance, impact resistance, waterproofness, etc. The exterior parts should also be preferably made of material having good adhesiveness with an adhesive so as to be firmly fixed to the solar cell element or back reinforcement member.

With the above described elements taken into consideration, the exterior parts can be made of plastics such as a resin, e.g., polycarbonate, polyamide, polyacetal, modified PPO (PPE), polyester, polyallylate, unsaturated polyester, phenol resin, epoxy resin, polybutylene terephthalate resin, nylon, etc., engineering plastics, or the like. Further, a thermoplastic resin such as ABS resin, polypropylene, polyvinyl chloride or the like can also be used.

Furthermore, when the DC-DC converters are attached to the light-receiving side, it is preferable to use carbon black as pigment or apply a resin paint for absorbing UV rays on the light-receiving surface to improve ultraviolet light resistance.

(Inverter)

The inverter used in the photovoltaic power generating system generally comprises a voltage booster circuit which boosts an input DC voltage to an input voltage of an inverter circuit, the inverter circuit which converts DC power to AC power, a control circuit which controls start/stop of power conversion, optimization of an operating point of a solar cell and operation mode, etc., a system-connected protection circuit, a communication circuit and an input/output terminal, etc., and its output is used for a load or interconnected.

As a voltage booster circuit, various publicly known or publicly used circuit systems can be used irrespective of whether they are insulated or not. As the inverter circuit, a voltage type inverter using an IGBT or MOSFET as a switching element is preferable. By driving the gate of the switching element through a control signal of the control circuit, it is possible to obtain AC power having a desired frequency, phase and voltage.

The control circuit is provided with, for example, a CPU, PWM waveform control circuit, frequency/voltage reference generator, maximum power point tracking control circuit, current reference generator, mode switch and switching control circuit, etc. Furthermore, when a plurality of inverters of this embodiment are connected to one solar cell element, the control circuit can also be made manipulatable from the outside through a communication wire, etc., and the control circuit itself can also be concentrated outside the inverter to control the plurality of inverters all together.

When the inverter of this embodiment is electrically connected to the solar cell element, the inverter is preferably placed close to the solar cell element so as to input the output from the solar cell element efficiently and preferably directly connected to the solar cell element.

Furthermore, there are two types of the inverter 3, with or without an insulating transformer, and either one can be used depending on its application. When an inter-device connection member between the DC-DC converters and the inverter is grounded, an inverter having an insulating transformer is used.

The inverter needs to have properties such as heat resistance, humidity resistance, water resistance, electrical insulation, low-temperature resistance, oil resistance, weather resistance, impact resistance, waterproofness, etc., according to its operating conditions. The inverter should also be preferably made of material having good adhesiveness with an adhesive so as to be firmly fixed to the solar cell element.

With the above described elements taken into consideration, the exterior parts can be made of plastics such as a resin, e.g., polycarbonate, polyamide, polyacetal, modified PPO (PPE), polyester, polyallylate, unsaturated polyester, phenol resin, epoxy resin, polybutylene terephthalate resin, nylon, etc., engineering plastics, or the like. Further, a thermoplastic resin such as ABS resin, polypropylene or polyvinyl chloride can also be used.

Furthermore, when the inverter is attached to the light-receiving side, it is preferable to use carbon black as pigment or apply a resin paint for absorbing UV rays on the light-receiving surface to improve UV light resistance.

Then, the method of producing the photovoltaic power generating apparatus and photovoltaic power generating system of this embodiment will be explained in detail.

(Production Method)

Figure 6:
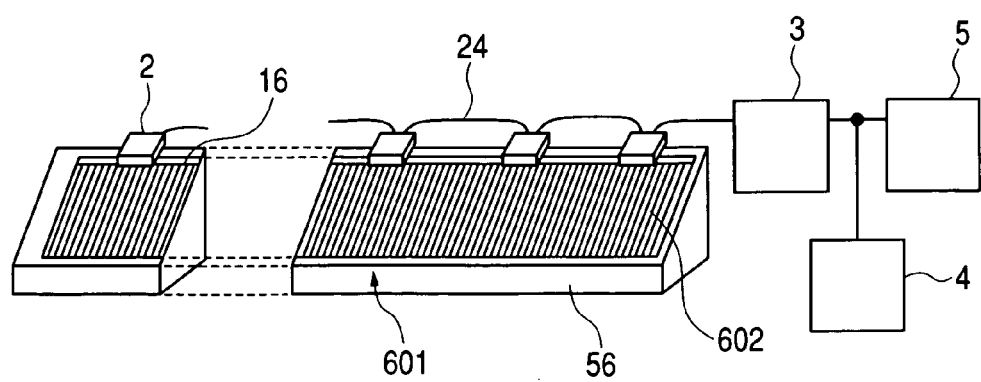
FIG. 6 is an external view showing an outline of the photovoltaic power generating system according to the first embodiment of the present invention.

FIG. 6 is a schematic external view of the photovoltaic power generating system of this embodiment and reference numeral 602 denotes a solar cell element in the above described configuration, 2 denotes a DC-DC converter, 3 denotes an inverter, 4 denotes a load and 5 denotes a commercial system.

More specifically, a roll of a cleaned long stainless steel substrate of 0.1 mm thick, 250 mm wide and 300 m long is transferred as the conductive substrate 10 first and a layer of Al containing 1% of Si was formed in a thickness of 5,000 Å as the lower electrode layer 11 using a sputtering method. Then, a p/i/n-type amorphous silicon semiconductor layer 12 was formed using $PH_3$, $SiH_4$ and $H_2$ gases for an n-type semiconductor, $SiH_4$ and $H_2$ gases for an i-type semiconductor and $B_2H_6$, $SiH_4$ and $H_2$ gases for a p-type semiconductor, thereby forming the n-type semiconductor layer of 300 Å in thickness, the i-type semiconductor layer of 4,000 Å in thickness and the p-type semiconductor layer of 100 Å in thickness by a plasma CVD method for each film formation apparatus through which the stainless steel substrate passed.

Then, ITO having a film thickness of 800 Å was formed as the upper electrode layer 13 using resistance heating vapor deposition.

Then, in order to divide the photovoltaic layer created in this way into a plurality of portions, an etching paste containing $FeCl_3$ and $AlCl_3$, etc., was applied to the upper electrode to be divided using a screen printing method, heated and then cleaned, part of the upper electrode was removed in a linear form, etching lines 115 of 1 mm wide were formed at intervals of 5,500 mm and a photovoltaic layer was formed separated by the etching lines.

Then, as shown in FIG. 4, a polyimide substrate double-side adhesive tape 25 (200 μm thick (base material 100 μm)) was continuously pasted to one side on the light-receiving side of the conductive substrate as an insulating double-side adhesive tape of 7.5 mm wide first.

Then, a carbon wire consisting of a φ100 μm copper wire coated beforehand with a carbon paste was formed with a 5.6 mm pitch on the power generation area of the photovoltaic layer and the polyimide base material double-side adhesive tape 25 as the current collection electrode 14.

Then, a silver-plated copper foil of 5 mm wide, 245 mm long and 100 µm thick was placed on the polyimide base material double-side adhesive tape 25 as a light-receiving surface terminal member 16, heated and press-bonded simultaneously with the current collection electrode 14 under conditions of 200° C., approximately $4 \times 10^5$ Pa (3 kgf/cm$^2$), 180 sec.

Furthermore, as shown in FIG. 5, a transparent thin film resin layer 23 was stacked on the light-receiving surface of the solar cell element by coating a fluororesin paint to a thickness of 100 µm using a spray coating method. This transparent thin film resin layer was stacked in such a way that only the portion having photoelectric conversion characteristics (active area) for the incident light of the solar cell element was covered.

Then, the transparent thin film resin layer was cut from the roll along the etching lines at intervals of 5,500 mm to obtain a solar cell element 602 (FIG. 6) having the transparent thin film resin layer formed on the conductive substrate.

Furthermore, lead members (not shown) are connected to the light-receiving surface terminal member 16 and conductive substrate 10 as connection terminals to the DC-DC converter 2 and ten DC-DC converters 2 are adhered so as to cover a part of the light-receiving side terminal member 16 at an interval of 500 mm using a silicon adhesive, the above described lead members and the input terminals of the DC-DC converters 2 are connected inside the DC-DC converters 2, then a cover is put to the DC-DC converters 2 and in this way a photovoltaic power generating apparatus 601 provided with the DC-DC converters 2 as shown in FIG. 6 is formed. In this embodiment, the conductive substrate 10 also serves as an electrode to extract electric power from the solar cell element.

Then, the photovoltaic power generating apparatus 601 is pasted to the support 56 using an epoxy resin adhesive.

Then, ten DC-DC converters 2 attached to the solar cell element 602 are connected one by one using a connection cable 24 and input to the inverter 3 all together.

The connection cable 24 includes two positive, negative electric wires and each cable is electrically connected to the output terminals of the DC-DC converters inside the DC-DC converters and is also electrically connected to the cable connected to the neighboring DC-DC converters.

Using the same method, the photovoltaic power generating apparatuses 601 are mounted in ten support bodies 56 one by one using the same method and these outputs are converted to AC power through the inverter 3 and supplied to the load 4 or system 5.

(Explanation of Operation)

Here, using the DC-DC converter 2 shown in FIG. 7 and the circuit diagram of the inverter 3 shown in FIG. 8, the main circuits and control circuits and their respective operations will be explained in detail.

Figure 7:
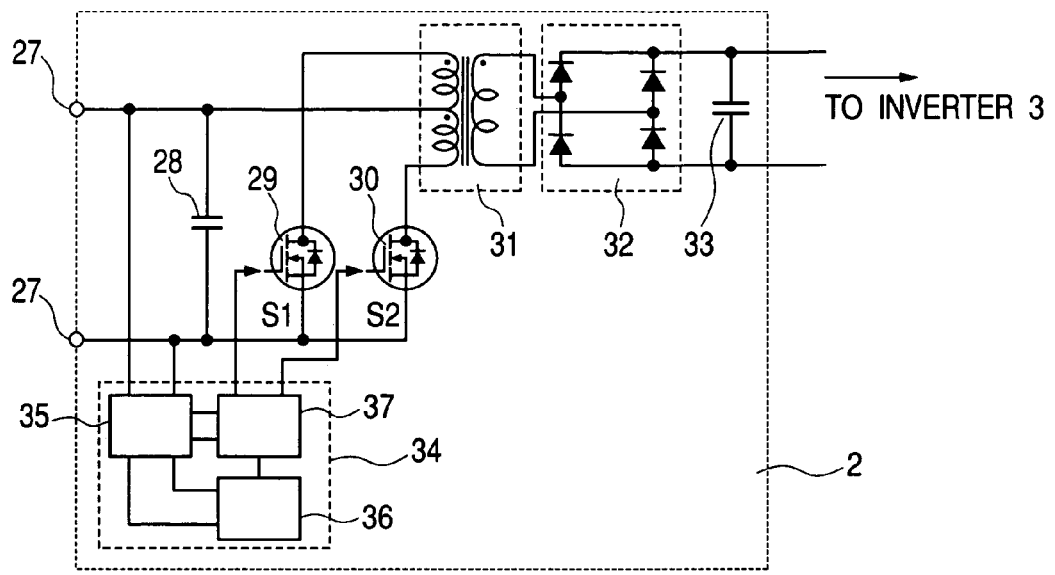
FIG. 7 is a circuit diagram showing an example of a DC-DC converter.

In the DC-DC converter 2 shown in FIG. 7, the output power of the solar cell element is stored in a capacitor 28 through input terminals 27 of the DC-DC converter 2 and converted to AC power by turning ON/OFF the MOSFETs 29 and 30 alternately.

Then, the AC power input to a switching transformer 31, is converted to AC power with a predetermined transformation ratio (1:175 in this embodiment), further rectified by a diode bridge 32, passed through a filter capacitor 33 and then output from the DC-DC converter 2 to the inverter 3.

Though not used in this embodiment, a coil for filtering may also be provided between the diode bridge 32 and filter capacitor 33 and both the filter capacitor and coil for filtering may also be omitted depending on the configuration of the system.

Then, a control circuit 34 of the DC-DC converter 2 will be explained. The control circuit 34 of this embodiment consists of a control power supply generation circuit 35, a reference waveform generation circuit 36 and a MOSFET driver 37, the input of the control power supply generation circuit 35 is connected to both ends of the capacitor 28 and the control signal output of the MOSFET driver 37 is connected to the gates of the MOSFETs 29 and 30.

A detailed operation of the control circuit 34 will be shown below. When the voltage of the solar cell element 1 reaches the starting voltage of the control power supply generation circuit 35, the output voltage of the control power supply generation circuit 35 is input to the reference waveform generation circuit 36 and MOSFET driver 37.

Then, the reference waveform generation circuit 36 operates first, a preset square wave at a reference frequency is input to the waveform input section of the MOSFET driver 37, gate drive signals S1 and S2 are input from the MOSFET driver 37 to the gates of the MOSFETs 29 and 30 to thereby turn ON/OFF the MOSFETs 29 and 30 at a fixed duty alternately.

Figure 8:
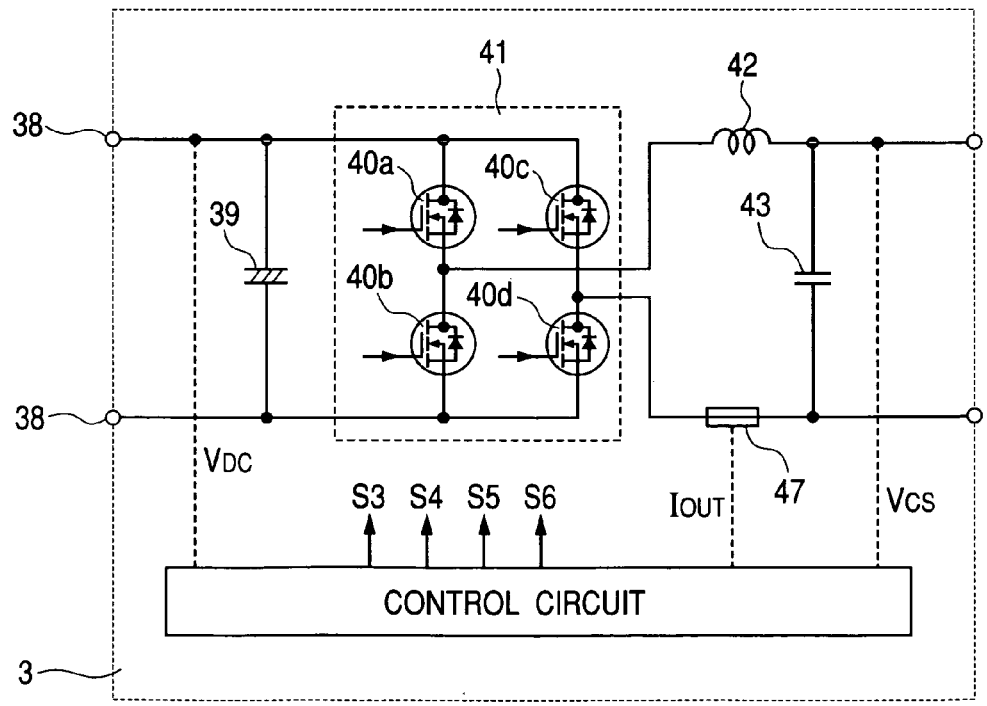
FIG. 8 is a circuit diagram showing an example of an inverter.

Furthermore, as shown in FIG. 8, the main circuit of the inverter 3 is constructed of input terminals 38 to which output power of a plurality of DC-DC converters 2 is input, a smoothing capacitor 39, a full bridge circuit 41 made up of transistors 40a, 40b, 40c and 40d, a coil 42 and a capacitor 43.

Figure 9:
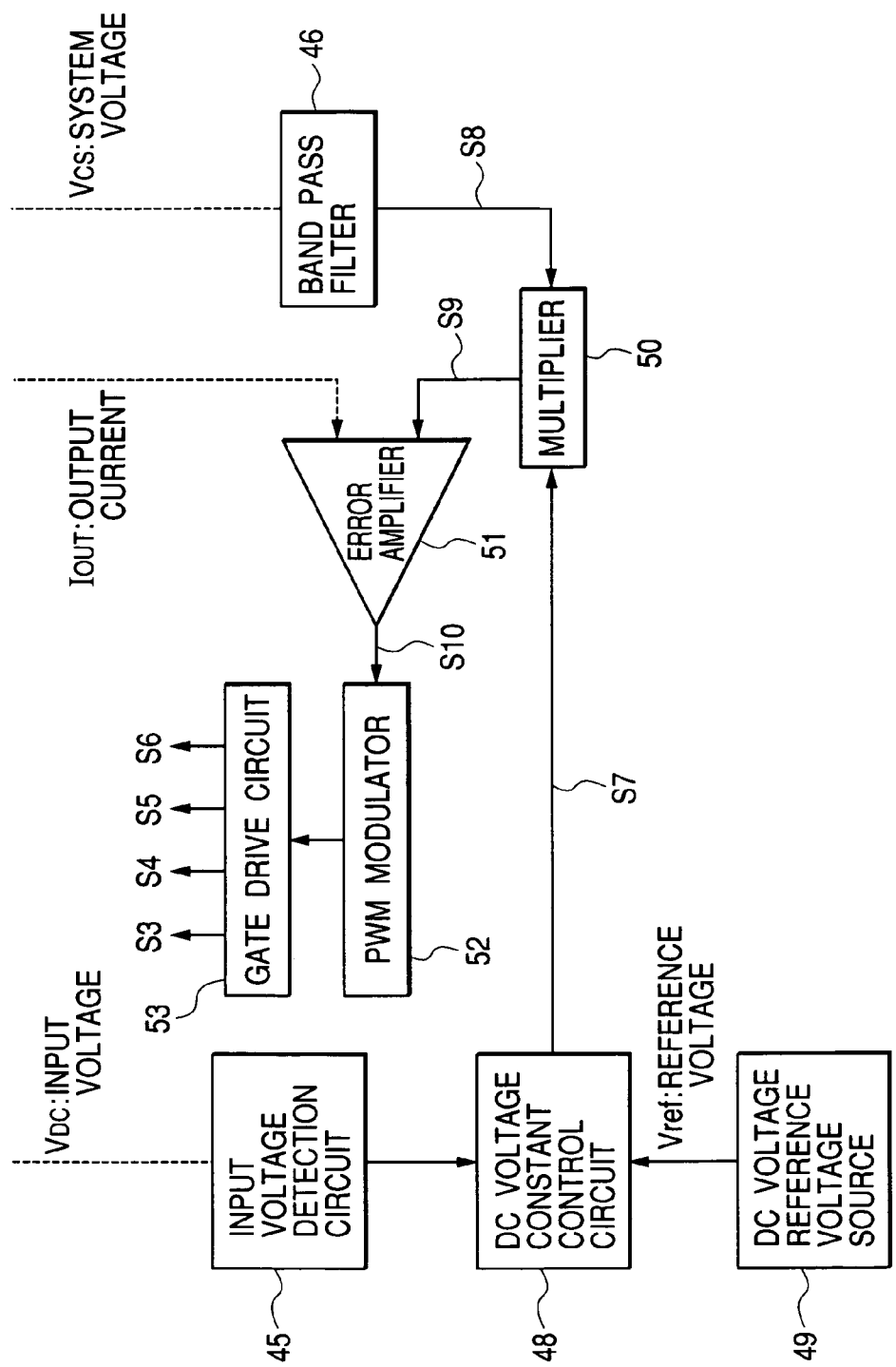
FIG. 9 illustrates a PWM control system of the inverter according to the present invention.

Furthermore, the control circuit of the inverter 3 is divided into portions controlling start/stop of power conversion, optimization of an operating point of the solar cell and operation modes, etc., but only portions related to PWM control in connection with the present invention will be explained in detail using FIG. 9 here.

As shown in the figure, the PWM control section is constructed of an input voltage detection circuit 45, a band pass filter (BPF) 46, an output current detector 47 (shown in FIG. 8), a DC voltage constant control circuit 48, a DC voltage reference voltage source 49, a multiplier 50, an output current control error amplifier 51, a PWM modulation circuit 52 and a gate drive circuit 53 which drives transistors 40a to 40d of the full bridge circuit 41.

Furthermore, a specific method of PWM control is as follows. First, the input voltage detection circuit 45 detects an inverter input voltage $V_{DC}$, the DC voltage constant control circuit 48 generates an error signal S7 indicating a difference between the inverter input voltage $V_{DC}$ and a reference voltage $V_{ref}$ of the DC voltage reference voltage source 49 and uses this error signal S7 as one input to the multiplier 50. Furthermore, a commercial system voltage $V_{cs}$ is detected, the BPF 46 extracts a fundamental component and uses a reference sine wave signal S8 thereof as the other input to the multiplier 50. The multiplier 50 multiplies the input error signal S7 by the reference sine wave signal S8 to generate an inverter output current reference signal S9.

Furthermore, the error amplifier 51 receives the inverter output current reference signal S9 from the multiplier 50 and inverter output current $I_{OUT}$ detected by the output current detector 47 as inputs and outputs a modulation reference error signal S10 which is obtained by amplifying the difference between the two to the PWM modulation circuit 52. The PWM modulation circuit 52 performs PWM control based on the input modulation reference error signal S10, drives the transistors 40*a* to 40*d* by gate drive signals S3 to S6 through the gate drive circuit 53 and controls the transistors so as to obtain an inverter input voltage $V_{DC}$ which matches the reference voltage $V_{ref}$.

The operation of the full bridge circuit is well known and so explanations thereof will be omitted here.

Thus, when the outputs of a plurality of DC-DC converters 2 which perform a switching operation on the MOSFETs at a fixed duty to perform control in such a way that the boosting voltage ratio is constant are connected to the inverter 3 which performs input voltage constant control, the DC-DC converters 2 operate at a constant input voltage. This is because the DC-DC converters which perform boosting voltage ratio constant control at a fixed duty act as an impedance converter, and as a result perform control in such a way that the operating voltage of the solar cell element becomes constant.

That is, when the input voltage of the inverter 3 is set to 175 V in this embodiment, the output voltages of all the DC-DC converters 2 connected to the input side of the inverter 3 become substantially 175 V and the operating voltage of the solar cell element operates at approximately 1 V which is an optimum operating voltage according to the boosting voltage ratio of the switching transformer.

The case where the inverter 3 performs input voltage constant control has been so far explained, but by using a current detection circuit (not shown) for the input section of the inverter, it is also possible to measure electric power from the voltage and current of the inverter input section and control the input voltage of the inverter so as to perform maximum power point tracking control to maximize the magnitude of this electric power.

In this case, it is possible to change the input voltages of the DC-DC converters 2 by changing the input voltage of the inverter 3, that is, change the output voltage of the solar cell element, and therefore even in the case where sunlight changes, it is possible to set an output voltage of the solar cell element only through maximum power follow-up control of the inverter 3 so that the input power to the inverter 3 becomes a maximum.

As shown above, this embodiment forms a long solar cell element with a large area on a conductive substrate, eliminates a cutting step, end etching step, serial connection step and bypass diode connection step, etc., which are necessary to manufacture a conventional, general solar cell module, and can thereby reduce production and material costs and considerably improve the efficiency of area power generation of the photovoltaic power generating apparatus.

Furthermore, instead of setting solar cell elements one by one at regular intervals, this embodiment only requires that a photovoltaic power generating apparatus having a long solar cell element with a large area formed on a single conductive substrate should be mounted on the support, and can thereby simplify the mounting work. Thus, compared to the conventional mounting work of mounting and connecting solar cell elements one by one, this embodiment can drastically shorten the time required to mount the photovoltaic power generating apparatus and reduce the mounting cost.

Furthermore, this embodiment connects a plurality of DC-DC converters in parallel to a long solar cell element with a large area formed on a single conductive substrate, and therefore, compared to the conventional configuration in which a plurality of solar cell elements are connected in parallel by wiring members and their outputs are connected to the inverter all together, if the voltage boosting ratio at the DC-DC converter is assumed to be approximately n times, it is possible to reduce current-collection loss to the order of $(1/n)^2$ when wiring of the same cross-sectional area (same resistance value). This makes it possible to considerably reduce the cross-sectional area of the member connecting the DC-DC converters in parallel, drastically reduce the material cost, reduce its weight and improve ease of mounting.

In addition, the absence of serially connected solar cell elements limits influences of partial shadows only to the DC-DC converters in the vicinity of the area where partial shadows have occurred and has no influence on other DC-DC converters. This makes it possible to construct a photovoltaic power generating system with considerably small influences of partial shadows compared to conventional serially connected solar cell elements. When compared to the conventional system with the same power generation capacity, this effect becomes more noticeable in proportion to the capacity of power generation.

Furthermore, in the above-described conventional system having serially connected solar cell elements, the presence of variations in the output characteristics of the individual solar cell elements causes solar cell elements having poor output characteristics to influence other solar cell elements, leading to an output reduction of the entire photovoltaic power generating system. On the other hand, the photovoltaic power generating system of this embodiment is constructed of a single solar cell element on a conductive substrate, a semiconductor layer, electrode layer, etc., on a single conductive substrate can be obtained through continuous film formation, which reduces variations in the characteristics of the solar cell element caused by production and considerably reduces variations in the output characteristics.

Thus, the photovoltaic power generating system of this embodiment can achieve the special effect of reducing loss due to shadow loss or loss by characteristic variations, which could not have been attained conventionally.

Furthermore, the DC-DC converters connected to the solar cell element are controlled to a fixed voltage boosting ratio at a fixed duty and the inverter connected in parallel to a plurality of such DC-DC converters performs input voltage constant control or maximum power point tracking control, and one inverter can thereby control operating points of the respective solar cell elements, simplify the control sections of the respective DC-DC converters, improve reliability and reduce the cost.

Furthermore, in the case of the conventional photovoltaic power generating system having serially connected solar cell elements, if such live parts are exposed, for example, a mode is given in which environment resistant coating of the solar cell element is simplified and/or the member connecting solar cell elements serially or in parallel is used exposed without insulating coating, which causes the following problems.

That is, electrodes and wiring members of the solar cell elements and at least some live parts of the member connecting the solar cell elements serially or in parallel are exposed and not insulated, and so they are placed in a damp and wet condition (state in which the resistance between the solar cell element live part and ground is reduced by water content) due to rainwater, etc., and with subsequent solar radiation, a leakage current path is formed in paths such as [solar cell element live part]—[rainwater]—[damp and wet support]—[rainwater]—[ground] or [solar cell element live part]—[rainwater]—[ground].

This results in a problem that metal ions constituting the live parts flow out from the live parts and promote corrosion of the electrodes, wiring members or serial or parallel connection members. It is known that especially when copper is used for the serial or parallel connection members, a current path is formed and copper is ionized and eluded considerably, drastically reducing the life of the connection members.

That is, in the above described conventional photovoltaic power generating system, if a plurality of solar cell elements are serially connected, at the end closest to the positive electrode of the serially connected body, the potential difference from ground increases considerably, facilitating progress of corrosion of the connection members. To cope with this problem, the solar cell elements may be connected in parallel, but in this case, as the number of solar cell elements connected in parallel increases, the current that flows also increases. Since the current-collection loss is proportional to the square of the current, there is a problem that trying to suppress the current-collection loss to a certain value or below will increase the cross-sectional area of the parallel connection members considerably.

In order to promote a further cost reduction, this embodiment also connects a plurality of DC-DC converters to one solar cell element even when the photovoltaic power generating system has a structure with an exposed live part. This drastically reduces the potential of the solar cell element with respect to the potential of ground compared to the conventional system with serial connection, and can thereby prevent corrosion of wiring members from advancing and improve reliability.

(Second Embodiment)

A second embodiment of the photovoltaic power generating system according to the present invention will be explained below. Explanations of the same parts as those of the first embodiment will be omitted and characteristic parts of this embodiment will be principally explained below.

Figure 10:
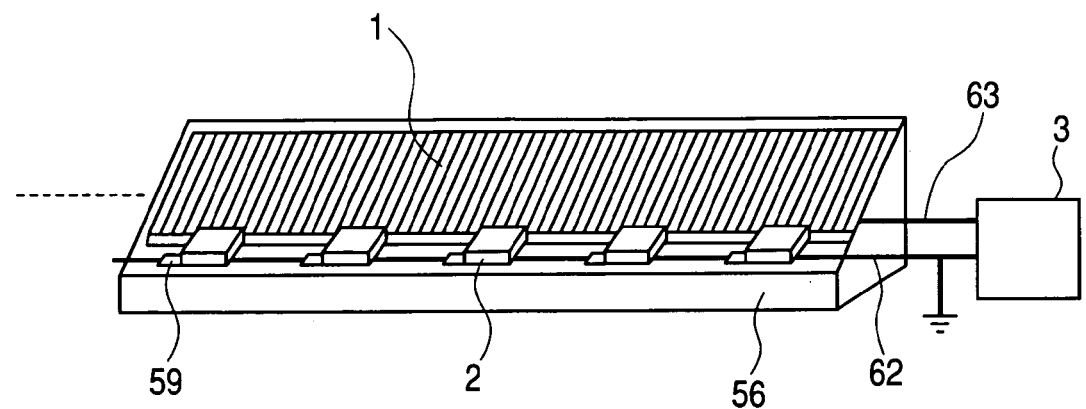
FIG. 10 is an external view showing an outline of a photovoltaic power generating system according to a second embodiment of the present invention.
Figure 11:
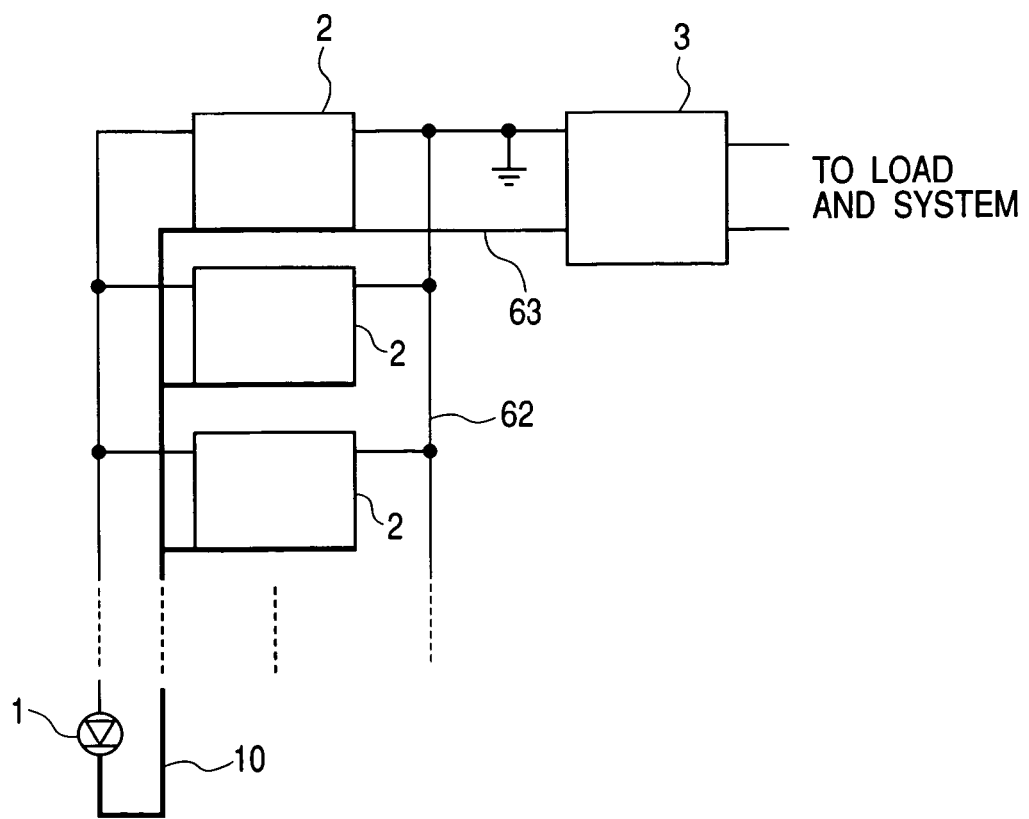
FIG. 11 is a circuit diagram showing a schematic configuration of the photovoltaic power generating system of FIG. 10.

FIG. 10 is an external view showing a schematic configuration of the second embodiment and FIG. 11 is an equivalent circuit diagram of the second embodiment.

As a solar cell element 1 of this embodiment, substantially the same one as that of the first embodiment is used and detailed explanations thereof will be omitted.

Figure 12:
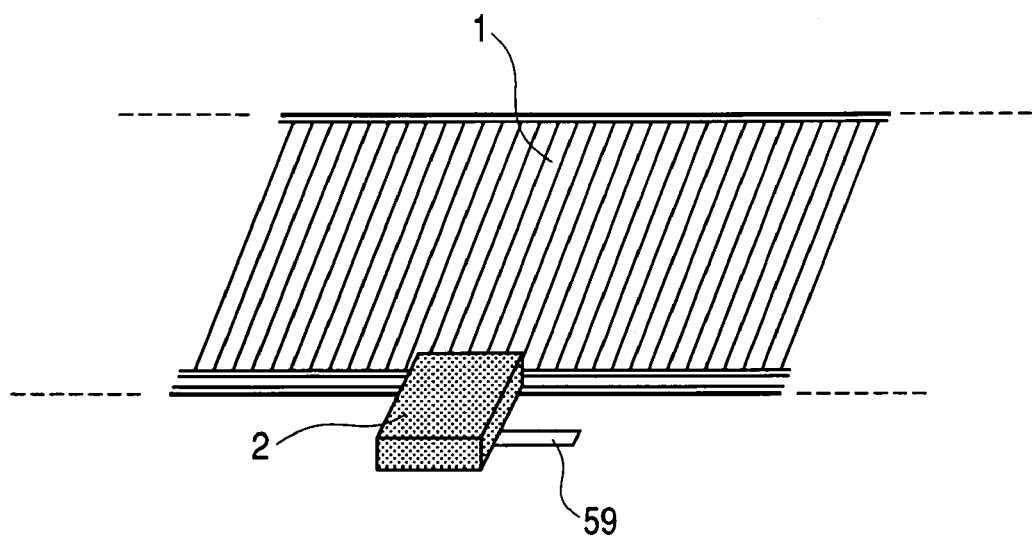
FIG. 12 is an enlarged view showing a connecting portion of an individual solar cell element and a DC-DC converter of FIG. 10.

FIG. 12 is an enlarged view of a connection portion between the solar cell element 1 and DC-DC converter 2 of this embodiment. Here, the position in the solar cell element at which the DC-DC converter 2 is attached is the same as that of the first embodiment, but the second embodiment is different in that an output terminal 59 is drawn out of the exterior part of the DC-DC converter 2.

The output terminal 59 is a terminal member connected to a high voltage side output terminal of the DC-DC converter 2 and the interior of the DC-DC converter 2 is filled with a filler to prevent water, etc., from entering the DC-DC converter 2 through the outlet of this output terminal 59.

Figure 13:
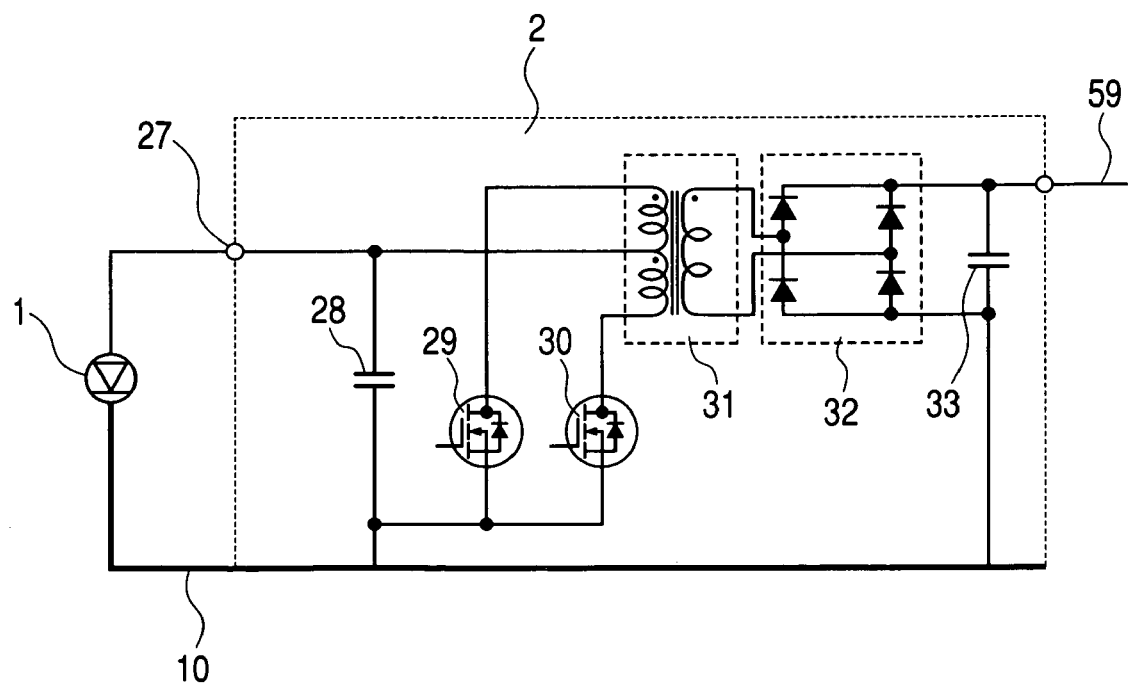
FIG. 13 is a circuit diagram showing a connection of a main circuit of the DC-DC converter of FIG. 10 and the conductive substrate of the solar cell element.

Furthermore, the same circuit in the first embodiment explained with reference to FIG. 7 is used as the internal main circuit of the DC-DC converter 2 in this embodiment, but as shown in the circuit diagram in FIG. 13, this embodiment electrically connects the primary low voltage side terminal of the switching transformer 31 and the secondary low voltage side terminal to the conductive substrate 10 of the solar cell element 1 to thereby cause the primary low voltage side to have the same potential as the secondary low voltage side.

Figure 14:
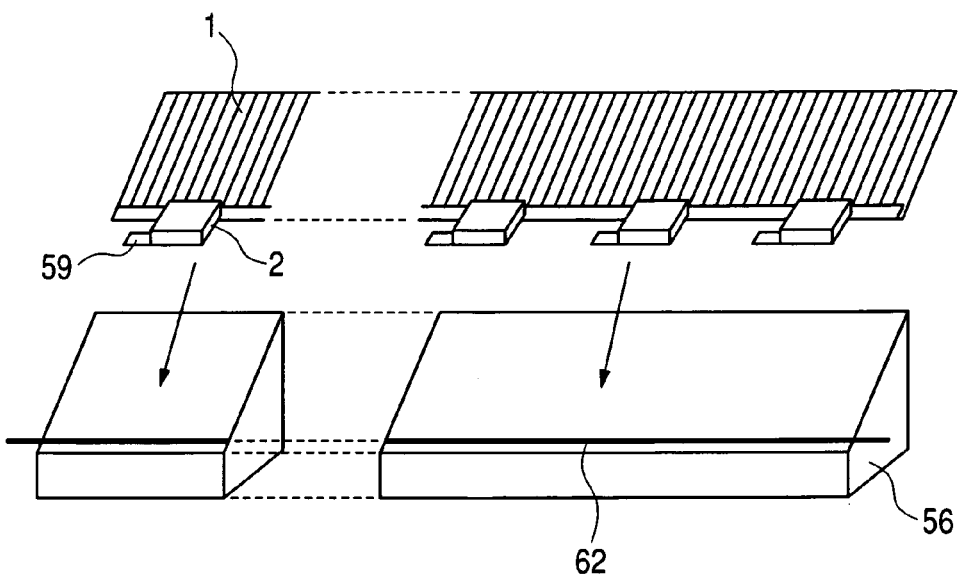
FIG. 14 illustrates a method of mounting the photovoltaic power generating system of FIG. 10.

Then, as shown in FIG. 14, a copper band 62 having a cross-sectional area of 0.1 mm$^2$ is laid beforehand as a parallel connection member on the support 56 using an epoxy-based adhesive, the solar cell element provided with the DC-DC converters 2 is adhered and fixed to the support 56 using an epoxy-based adhesive and output terminals 59 which are drawn out of the DC-DC converters 2 are electrically connected to the copper band 62 one by one.

Furthermore, an inter-device wiring member 63 on the low voltage side is connected to the conductive substrate 10, this inter-device wiring member 63 and copper band 62 are input to the inverter 3, DC power output from each DC-DC converter 2 is converted to AC power and interconnected to a load or a commercial system.

Figure 15:
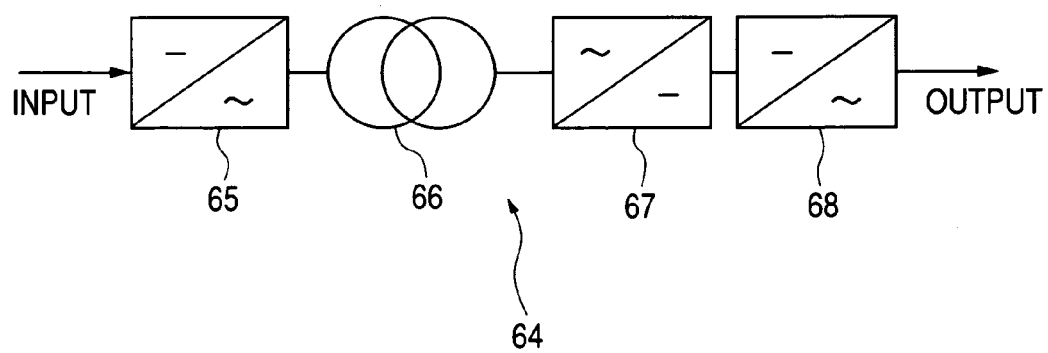
FIG. 15 illustrates a schematic configuration of an inverter of high-frequency link type used in the photovoltaic power generating system of FIG. 10.

This embodiment uses a high-frequency link type inverter 64 as shown in FIG. 15 as the inverter 3. This inverter 64 converts the DC output from the DC-DC converter-2 to high-frequency AC by a high-frequency inverter 65, applies insulation by a small high-frequency transformer 66, converts the AC to DC by an AC/DC converter 67 and further converts it to AC at a commercial frequency by a DC/AC converter 68 and outputs the AC.

Then, this embodiment grounds a copper band 62 as shown in FIG. 10 to complete a photovoltaic power generating system. That is, in the configuration of this embodiment, the respective DC-DC converters 2 are electrically united through a conductive substrate 10 of the solar cell element 1, and therefore one of the output terminals of each DC-DC converter is wired on the conductive substrate and has an excellent feature that only a single wiring member suffices to connect the DC-DC converters.

Furthermore, for a cost reduction, this embodiment adopts a technique of only coating the active area with a transparent thin film resin layer without using any sealing member.

As described above, by grounding the copper band 62 which is a parallel connection member, the copper band 62 which is the high voltage side of the parallel connection member has a zero potential with respect to the ground as illustrated in the equivalent circuit diagram of the photovoltaic power generating system in FIG. 11.

Therefore, the low voltage side of the parallel connection member becomes a negative potential with respect to the ground and the conductive substrate 10 connected thereto also has the same potential and the low voltage side of the solar cell element 1 also becomes a negative potential.

At this time, the voltage at both ends of the solar cell element 1 is smaller than the potential difference between the copper band 62 and conductive substrate 10 and the member on the high voltage side such as a light-receiving surface terminal member of the solar cell element 1 is also kept to a negative potential with respective to the ground, and it is thereby possible to prevent corrosion of the wiring member from advancing.

Figure 16:
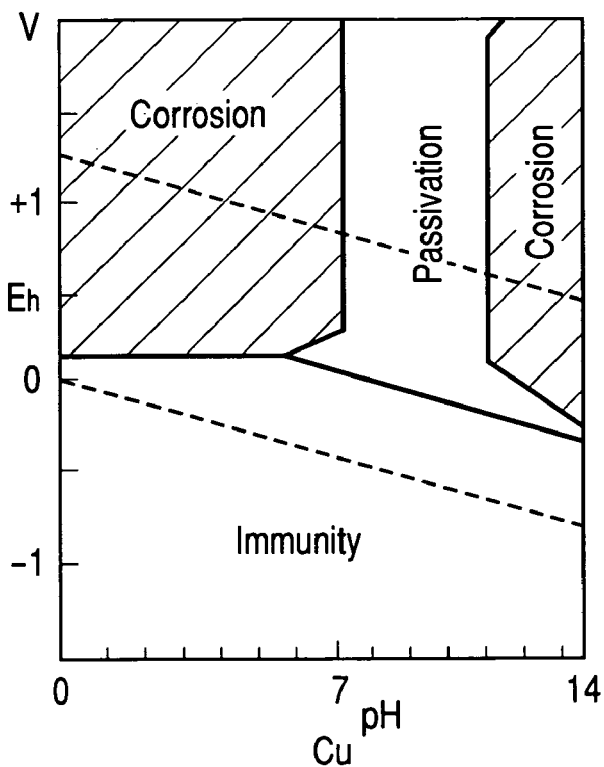
FIG. 16 illustrates a potential-pH diagram of copper.

This embodiment uses Cu for the parallel connection member 62 and inter-device wiring member 63, but as a property of copper, it is known that copper is easily eluded when a positive potential is applied as shown in the potential-pH diagram shown in FIG. 16. In view of this property, this embodiment is designed to always keep the wiring member made of copper to zero or negative potential with respect to the ground to prevent elusion of copper.

As shown above, according to the photovoltaic power generating system of this embodiment, in addition to the effect obtained in the first embodiment, the potentials of the solar cell element and wiring member with respect to the ground are zero or negative potential, which prevents corrosion of the wiring electrodes, etc., and has the effect of improving reliability.

(Third Embodiment)

A third embodiment of the photovoltaic power generating system according to the present invention will be explained below. Explanations of the same parts as those of the first embodiment and second embodiment will be omitted and characteristic parts of this embodiment will be principally explained below.

A solar cell element used in this embodiment has substantially the same configuration as that used in the first embodiment, but it is different only in a stacked configuration of the semiconductor layer.

More specifically, on a roll-shaped, cleaned, long stainless steel substrate of 0.1 mm thick as a conductive substrate, a layer of Al containing 1% of Si was formed using a sputtering method in a film thickness of 5,000 Å as a lower electrode layer. Then, an n/i/p-type amorphous silicon semiconductor layer was formed using $B_2H_6$, $SiH_4$ and $H_2$ gases for a p-type semiconductor, $SiH_4$ and $H_2$ gases for an i-type semiconductor and $PH_3$, $SiH_4$ and $H_2$ gases for an n-type semiconductor, thereby forming the p-type semiconductor layer of 100 Å in thickness, the i-type semiconductor layer of 4,000 Å in thickness and the n-type semiconductor layer of 300 Å in thickness, respectively one by one by a plasma CVD method.

Then, another n/i/p-type amorphous silicon semiconductor layer was stacked to form a double configuration layer.

Then, ITO having a film thickness of 800 Å was formed as an upper electrode layer using resistance heating vapor deposition to form a solar cell element.

Then, using the same steps as those in the first embodiment from here on, one solar cell element was completed on the conductive substrate. Then, a plurality of DC-DC converters are connected to this solar cell element at regular intervals.

Figure 19:
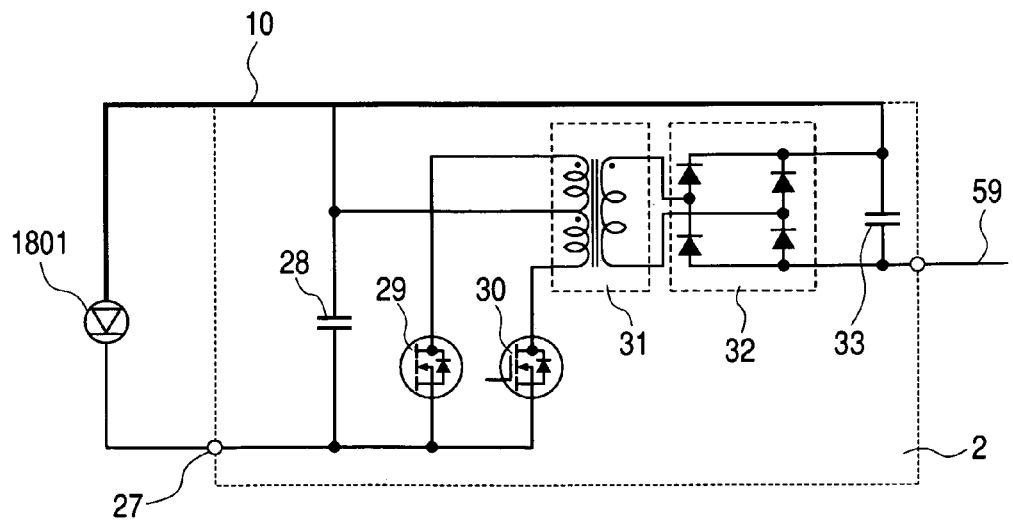
FIG. 19 is a circuit diagram showing a connection of a main circuit of the DC-DC converter of FIG. 17 and the conductive substrate of the solar cell element.

Since this embodiment uses an n/i/p-type amorphous silicon semiconductor layer for the solar cell element, unlike the first embodiment, the conductive substrate side becomes the high voltage side of the solar cell element. Furthermore, as shown in FIG. 19, inside the main circuit of the DC-DC converter 2, the primary high voltage side of the switching transformer 31 and the secondary high voltage side are electrically connected to the conductive substrate 10 of the solar cell element 1801, and in this way the primary high voltage side has the same potential as the secondary high voltage side.

Figure 17:
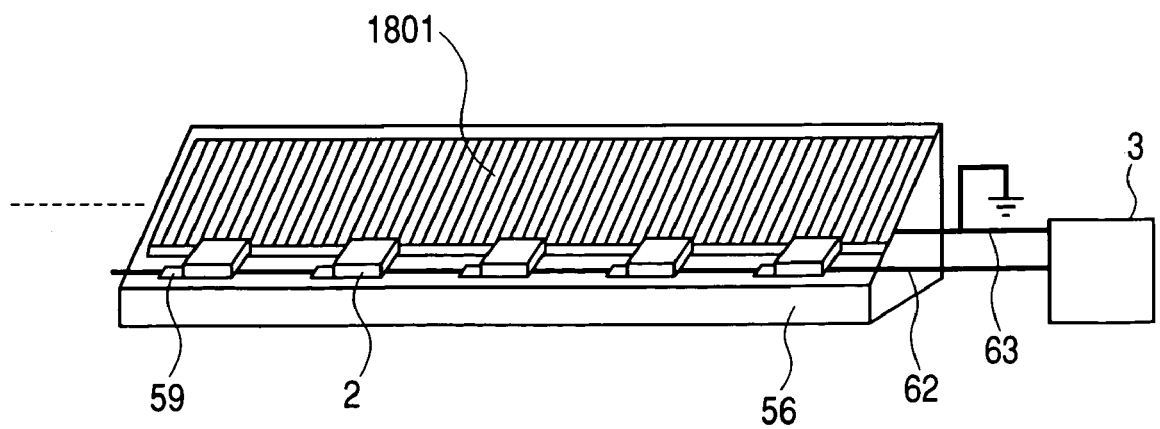
FIG. 17 is an external view showing an outline of a photovoltaic power generating system according to a third embodiment of the present invention.

Then, as in the case of the second embodiment, the photovoltaic power generating apparatus is mounted on a support 56, further connected to an inverter 3 and the conductive substrate 10 is grounded in this embodiment to obtain a photovoltaic power generating system of this embodiment as shown in FIG. 17.

As the inverter 3, a high-frequency link type inverter is used as in the case of the second embodiment.

This embodiment uses a bare copper band as a low voltage side member 62 of a parallel connection member, but one with an insulating coat can also be used preferably.

Figure 18:
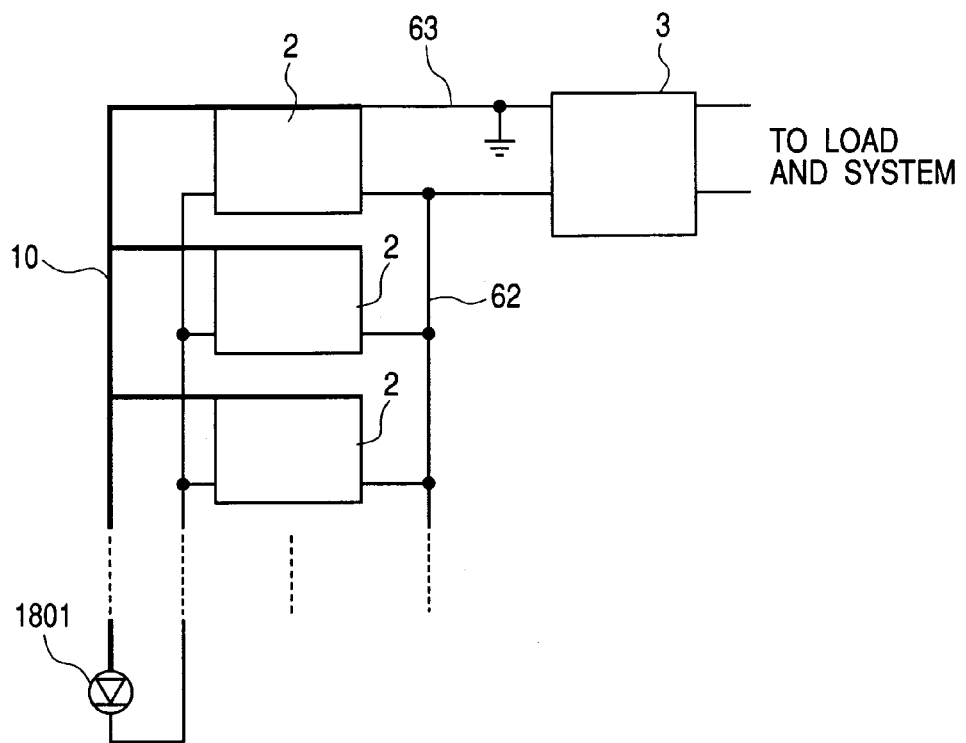
FIG. 18 is a circuit diagram showing a schematic configuration of the photovoltaic power generating system of FIG. 17.

For a cost reduction, this embodiment adopts a technique of coating only the active area where no sealing member is used with a transparent thin film resin layer and the overall circuit configuration of the photovoltaic power generating system can be expressed as shown in FIG. 18.

As shown in the equivalent circuit diagram of the photovoltaic power generating system in FIG. 18, by grounding the conductive substrate 10, which is a common electrode to the respective solar cell elements 1801, high voltage sides of the solar cell elements 1801 and inter-device wiring member 63 become zero potential with respect to the ground.

Therefore, all other wiring members are kept to a negative potential with respect to the ground, and in this way it is possible to prevent corrosion of the wiring member from advancing.

Thus, according to the photovoltaic power generating system of this embodiment, in addition to the effect obtained in the first embodiment, the potentials of the solar cell element and wiring member with respect to the ground become zero or negative potential, which produces the effect of preventing corrosion of wiring electrodes, etc., and improving reliability.

(Embodiment 4)

A fourth embodiment according to the present invention will be explained below. Explanations of the same parts as those of the first to third embodiments will be omitted and characteristic parts of this embodiment will be principally explained below.

Figure 20:
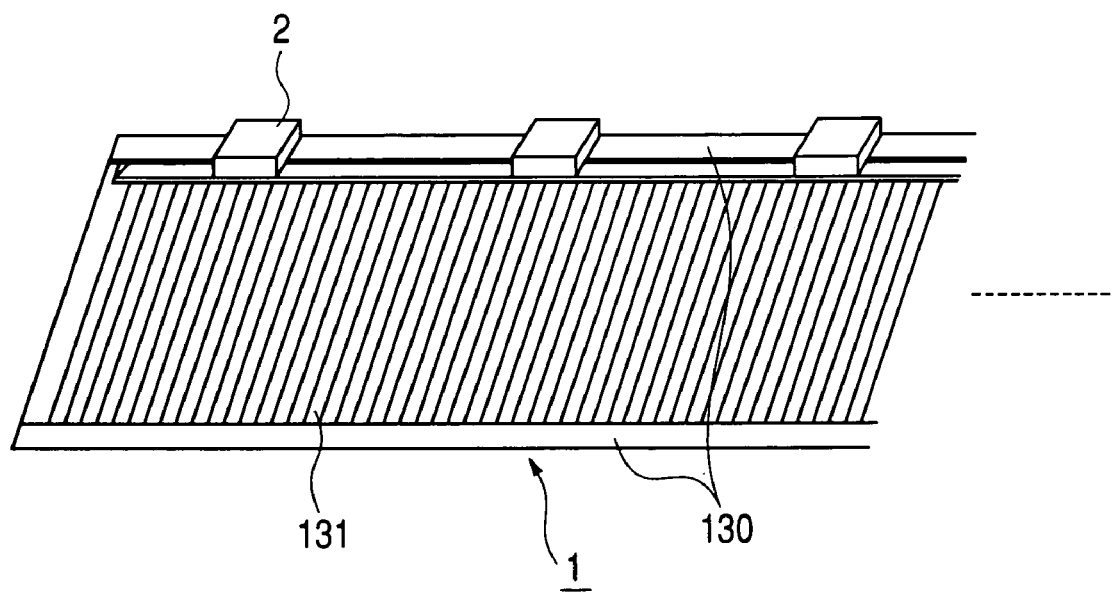
FIG. 20 is an external view showing an outline of a photovoltaic power generating apparatus according to a fourth embodiment of the present invention.

FIG. 20 shows part of a solar cell element used in the photovoltaic power generating apparatus of this embodiment. As shown in the figure, a solar cell element 1 used in this embodiment has a configuration similar to that of the solar cell element in the first to third embodiment, but the conductive substrate is provided with mounting sections 130 with no semiconductor layer at both ends of the conductive substrate.

The specific producing method is the same as that in the first embodiment. A roll-shaped cleaned long stainless steel substrate of 0.1 mm thick is used as a conductive substrate, a lower electrode layer, a semiconductor layer and an upper electrode layer are stacked on a conductive substrate with 20 mm margins from both ends of the conductive substrate and the area where these layers are not provided is used as mounting sections 130.

Then, as shown in FIG. 20, by linearly-removing the area between the upper electrode layer and mounting sections 130 to separate the mounting sections 130 from the live sections, etching lines 131 are formed.

Furthermore, as in the case of the first embodiment, DC-DC converters 2 are mounted to construct a photovoltaic power generating apparatus, and this is then mounted on a support.

In this embodiment, concrete nails are put in the mounting sections 130 by a tacker at 30 cm intervals to fix the DC-DC converters to the support.

As the support, a concrete material is used, but the support can also be formed of wood, plastics, etc., and in that case, the support can be fixed using nails and screws, etc.

Thus, this embodiment adopts a configuration which further facilitates the mounting of the photovoltaic power generating apparatus and can thereby reduce its mounting cost.

(Fifth Embodiment)

A fifth embodiment according to the present invention will be explained below. Explanations of the same parts as those of the above-described embodiments will be omitted and characteristic parts of this embodiment will be principally explained below.

Figure 21:
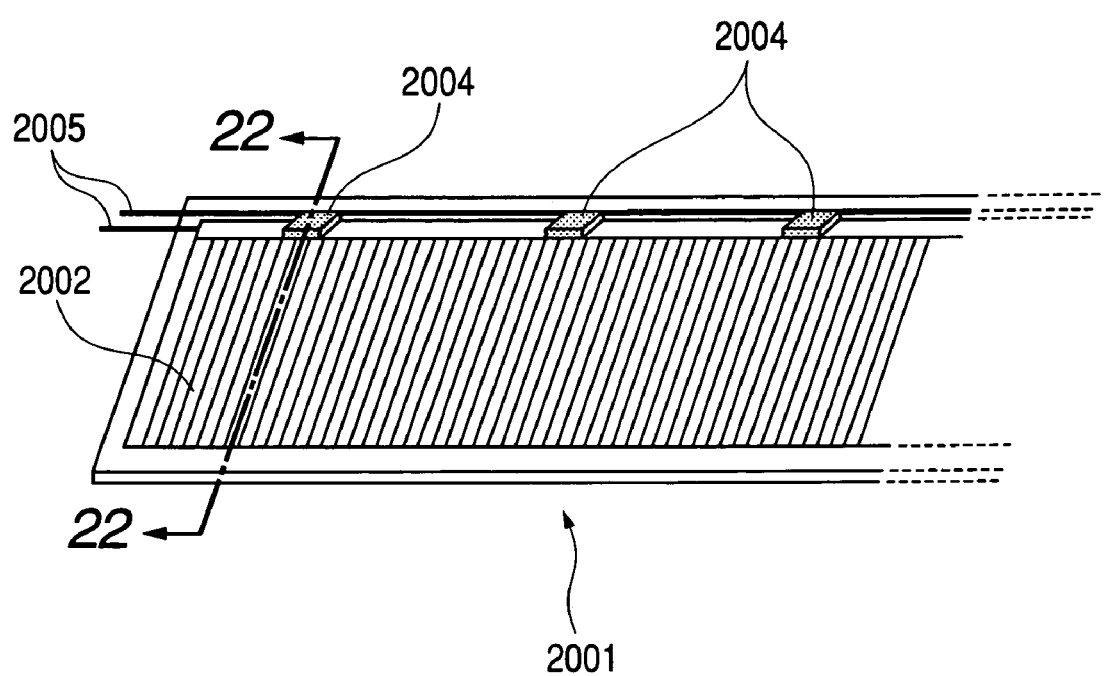
FIG. 21 is an external view showing an outline of a photovoltaic power generating apparatus according to a fifth embodiment of the present invention.

FIG. 21 shows a schematic configuration of this embodiment, and as shown in the figure, a photovoltaic power generating apparatus 2001 of this embodiment consists of a plurality of DC-DC converters 2004 connected to a solar cell element 2002.

As the solar cell element 2002 used in this embodiment, one similar to the solar cell element before carrying out a step of applying the transparent thin film resin layer of the second embodiment is used and the plurality of the DC-DC converters 2004 are electrically connected to a light-receiving surface terminal member 2005 and conductive substrate.

Furthermore, output terminals (not shown) of each of the DC-DC converters are electrically connected to the terminal member 2005 whereby all the DC-DC converters 2004 are connected in parallel.

Figure 22:
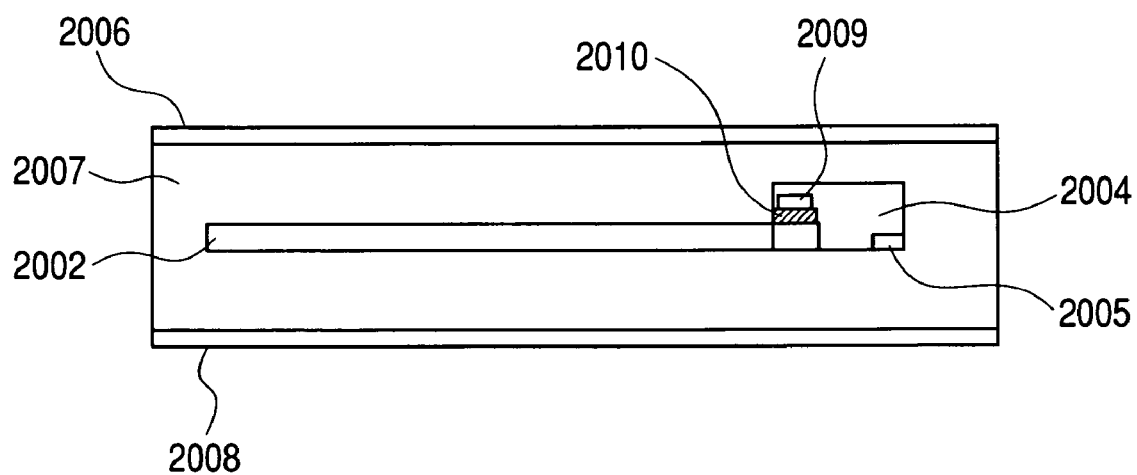
FIG. 22 is a cross sectional view along a line 22—22 in FIG. 21.

In this embodiment, the entire solar cell element assembly is sealed with resin by means of a weather resistant film, filler and back member with the DC-DC converters connected. FIG. 22 is a cross-sectional view along a line 22—22 in FIG. 21 and reference numeral 2006 denotes a weather resistant film, 2007 denotes a filler, 2008 denotes a back member, 2009 denotes a light-receiving surface terminal member and 2010 denotes a double-side adhesive tape.

As a specific example of the material used for this sealing, ETFE (ethylene tetrafluoroethylene) is preferable for the weather resistant film 2006, EVA (ethylene-vinyl acetate copolymer, weather resistant grade) is preferable for the filler 2007 and PVF/Al/PVF sheet, etc., is preferable for the back member 2008.

As the sealing method, the stacked body consisting of a back member, filler, solar cell element assembly, filler and weather resistant film stacked in that order is created by melting the filler at 150° C. using a vacuum laminator.

At this time, the terminal member 2005 drawn out of the solar cell element assembly is exposed from the end of the sealing member, and it is possible to use this terminal member 2005 to make an electrical connection with an adjacent photovoltaic power generating apparatus or an inverter.

The photovoltaic power generating apparatus of this embodiment can produce effects similar to those of the second embodiment.

(Other Embodiments)

The photovoltaic power generating system according to the above described embodiments of the present invention is intended to supply power to a commercial power system, but it goes without saying that the photovoltaic power generating system of the present invention may also be used to supply power to an AC power system other than a commercial AC power system such as self AC power generation equipment at a factory, etc.

What is claimed is:

1. A photovoltaic power generating apparatus comprising:
   a single solar cell element formed on a substrate; and
   a plurality of power conversion devices individually connected to the solar cell element for converting an output of the solar cell element,
   wherein the plurality of power conversion devices is provided on the solar cell element at predetermined intervals.

2. The apparatus according to claim 1, wherein the plurality of power conversion devices are DC-DC converters for boosting a DC voltage output from the solar cell element.

3. The apparatus according to claim 1, wherein the plurality of power conversion devices are inverters.

4. The apparatus according to claim 1, wherein a wiring member that electrically connects the solar cell element and a power conversion device of said plurality of power conversion devices has an exposed section at least at a part of a live part.

5. The apparatus according to claim 1, wherein the solar cell element comprises a photoelectric conversion layer, a current collection electrode disposed on a light-receiving side of the photoelectric conversion layer, a surface wiring member and a transparent thin film resin layer, and at least a part of the current collection electrode or the surface wiring member has an exposed section which is not covered with the transparent thin film resin layer.

6. The apparatus according to claim 1, wherein a photoelectric conversion layer of the solar cell element comprises thin film silicon.

7. The apparatus according to claim 1, wherein the substrate is conductive and a substrate side of a photoelectric conversion layer of the solar cell element constitutes a positive electrode.

8. The apparatus according to claim 2, wherein the substrate is conductive and an output of one of the DC-DC converters and one of outputs of the solar cell element are electrically connected to the substrate.

9. The apparatus according to claim 2, wherein an output of one of the DC-DC converters and one of outputs of the solar cell element are on a low voltage side.

10. The apparatus according to claim 1, wherein an output of one of the DC-DC converters and one of outputs of the solar cell element are on a high voltage side.

11. The apparatus according to claim 1, wherein the solar cell element has portions where no power generation section is formed on two peripheral sides thereof.

12. The apparatus according to claim 11, wherein the solar cell element is fixed to a support through one of the portions where no power generation section is formed.

13. The apparatus according to claim 1, wherein the solar cell element or the photovoltaic power generating apparatus itself is sealed with a resin.

14. The apparatus according to claim 1, wherein the solar cell element is a minimum power generation unit having a function as a solar cell.

15. The apparatus according to claim 14, further comprising a plurality of current collection electrodes for individually collecting power of the solar cell element, wherein each of the plurality of current collection electrodes is connected to one of the plurality of power conversion devices such that power individually collected by the plurality of current collection electrodes is converted individually.

16. A photovoltaic power generating system comprising:
   a photovoltaic power generating apparatus comprising a single solar cell element formed on a substrate and a plurality of DC-DC converters individually connected to the solar cell element for converting a DC output of the solar cell element; and
   an inverter for converting outputs of the plurality of DC-DC converters to AC power and supplying the AC power to a load or interconnecting the AC power to a commercial power systems,
   wherein the plurality of DC-DC converters is provided on the solar cell element at predetermined intervals.

17. The system according to claim 16, wherein the inverter has an insulating transformer, and wherein a wiring member connecting the inverter and one of the plurality of DC-DC converters is grounded.

18. A photovoltaic power generating system comprising the apparatus according to claim 1, wherein the plurality of power conversion devices are a plurality of inverters for converting outputs of the solar cell element to AC power, and wherein the plurality of inverters supply output power to a load or interconnect the output power with a commercial power system.

19. A method of producing a photovoltaic power generating apparatus comprising the steps of:
   forming a solar cell element on a substrate through a semiconductor producing step; and connecting a plurality of power conversion devices to predetermined portions of the solar cell element, wherein the plurality of power conversion devices is provided on the solar cell element at predetermined intervals.

20. The method according to claim 19, comprising a step of forming a photoelectric conversion layer, a current collection electrode and a surface wiring member on the substrate successively to form the solar cell element and a step of connecting the plurality of power conversion devices to predetermined portions of the solar cell element successively.

* * * * *

UNITED STATES PATENT AND TRADEMARK OFFICE
CERTIFICATE OF CORRECTION

PATENT NO. : 6,966,184 B2
APPLICATION NO. : 10/717641
DATED : November 22, 2005
INVENTOR(S) : Fumitaka Toyomura et al.

It is certified that error appears in the above-identified patent and that said Letters Patent is hereby corrected as shown below:

COLUMN 1
Line 45, Begin a new paragraph before "In".

COLUMN 2
Line 15, "solar," should read --solar--.

COLUMN 20
Line 14, "converter-2" should read --converter 2--.

COLUMN 23
Line 15, "material-used" should read --material used--.

COLUMN 24
Line 50, "systems," should read --system,--.

Signed and Sealed this

Tenth Day of October, 2006

JON W. DUDAS
*Director of the United States Patent and Trademark Office*